(12) United States Patent
Yang et al.

(10) Patent No.: US 7,379,136 B2
(45) Date of Patent: May 27, 2008

(54) TRANSFLECTIVE TYPE LIQUID CRYSTAL DISPLAY DEVICE AND METHOD FOR FABRICATING THE SAME

(75) Inventors: Joon Young Yang, Bucheon-shi (KR); Yong In Park, Seoul (KR); Sang Min Jang, Anyang-shi (KR); Su Seok Choi, Hanam-shi (KR); Sang Hyun Kim, Daegu-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 232 days.

(21) Appl. No.: 10/965,931

(22) Filed: Oct. 18, 2004

(65) Prior Publication Data
US 2005/0140869 A1    Jun. 30, 2005

(30) Foreign Application Priority Data
Dec. 29, 2003    (KR) ...................... 10-2003-0098723

(51) Int. Cl.
G02F 1/1335    (2006.01)
(52) U.S. Cl. ...................................... 349/114; 349/149
(58) Field of Classification Search ................ 349/114, 349/149
See application file for complete search history.

(56) References Cited
U.S. PATENT DOCUMENTS

| 6,466,280 B1 | 10/2002 | Park et al. |
| 2003/0086046 A1 | 5/2003 | You |
| 2004/0036071 A1 | 2/2004 | Yamazaki et al. |

FOREIGN PATENT DOCUMENTS

| CN | 1442732 | 9/2003 |
| JP | 2000-171793 | 6/2000 |
| JP | 2000-305099 | 11/2000 |
| JP | 2000-315734 | 11/2000 |
| JP | 2001-036090 | 2/2001 |
| JP | 2001-324723 | 11/2001 |

(Continued)

*Primary Examiner*—David Nelms
*Assistant Examiner*—Phu Vu
(74) *Attorney, Agent, or Firm*—McKenna Long & Aldridge, LLP

(57) ABSTRACT

A CMOS-TFT array substrate and a method for fabricating the same is disclosed, by a low-mask technology to decrease the usage count of masks, which includes a substrate comprising an active area having a plurality of pixel regions and a driving circuit area for driving the active area, each pixel region having a transmitting part and a reflective part; a first semiconductor layer having first source/drain regions formed in the pixel region; a second semiconductor layer having second source/drain regions formed in the driving circuit area; a gate insulating layer on an entire surface of the substrate including the first and second semiconductor layers; first and second gate electrodes on the gate insulating layer above the first and second semiconductor layers; a storage electrode in the pixel region; an insulating interlayer on the entire surface of the substrate; a transmitting electrode on the insulating interlayer of the transmitting part; a passivation layer on the entire surface of the substrate including the transmitting electrode; a reflective electrode on the passivation layer of the reflective part; first and second source/drain electrodes being in contact with the first and second source/drain regions; and a liquid crystal layer between the substrate and another facing substrate.

17 Claims, 18 Drawing Sheets

FOREIGN PATENT DOCUMENTS

| | | |
|---|---|---|
| JP | 2002-341366 | 11/2002 |
| JP | 2003-149638 | 5/2003 |
| JP | 2003-156756 | 5/2003 |
| JP | 2003-195275 | 7/2003 |
| JP | 2003-255376 | 9/2003 |
| JP | 2003-255399 | 9/2003 |

TRANSFLECTIVE TYPE LIQUID CRYSTAL DISPLAY DEVICE AND METHOD FOR FABRICATING THE SAME

This application claims the benefit of the Korean Application No. P2003-98723 filed on Dec. 29, 2003, which is hereby incorporated by reference for all purposes as if fully set forth herein.

BACKGROUND OF THE INVENTION

1. Field of the Invention

The present invention relates to a liquid crystal display (LCD) device, and more particularly, to a method for fabricating a CMOS-TFT array substrate by a low-mask technology.

2. Discussion of the Related Art

Recently, liquid crystal display (LCD) devices are widely used for flat displays because of their high contrast ratio, great gray scale and image display, and low power consumption.

In operation, the LCD device includes various patterns such as driving devices or lines on a substrate, which may be formed by photolithography. For example, a photoresist sensitive ultraviolet rays is coated on the substrate and a pattern formed using an optical mask is exposed and developed on the photoresist. Then, various material layers are etched using the patterned photoresist as a mask, and the photoresist is stripped. Accordingly, research for reducing the number of masks required has been actively pursued to improve productivity by decreasing the number of photolithography process.

Typically, the LCD device includes a TFT array substrate, a color filter substrate, a liquid crystal layer, and a driving circuit. At this time, the TFT array substrate includes a thin film transistor TFT for selectively applying signals to pixel electrodes, and a storage capacitor for maintaining a charging state until a unit pixel region is addressed to the next charging state. Also, the color filter substrate has a color filter layer for obtaining various colors. Also, the liquid crystal layer is formed between the two substrates, and the driving circuit causes images to be displayed according to external signals by driving the TFT array substrate.

In case of a transflective type LCD device, the unit pixel region is divided into a transmitting part and a reflective part. At this time, a transmitting electrode is formed in the transmitting part, and a reflective electrode is formed in the reflective part, whereby a constant voltage is applied to the liquid crystal layer.

The transmitting part displays the images by providing the light emitted from a backlight and incident on a lower substrate to the liquid crystal layer. Meanwhile, the reflective part displays the images by reflecting the ambient light incident on an upper substrate. Then, the driving circuit is provided on an additional PCB substrate, and is connected with the TFT array substrate by TCP. However, a method of forming the TFT array substrate without forming the driving circuit on the additional PCB substrate has been proposed recently.

Also, the thin film transistor is categorized into a thin film transistor for a pixel to drive the pixel regions in an active area, and a thin film transistor for a driving circuit to apply signals to gate and data lines in a pad area by operating the thin film transistor for a pixel. Typically, the thin film transistor for a pixel is formed of an n-type TFT of a high speed operation, and the thin film transistor for a driving circuit is formed of a CMOS (complementary metal-oxide semiconductor) thin film transistor, wherein the CMOS thin film transistor is comprised of the n-type TFT and a p-type TFT having a low power consumption.

Hereinafter, a method for fabricating a related art transflective type LCD device having a CMOS-TFT will be described with reference to the accompanying drawings.

First, as illustrated in FIG. 1A, a buffer layer 52 is formed on an insulating substrate 11, and a polysilicon layer is formed on the buffer layer 52. Then, a first photoresist (not shown) is deposited on the polysilicon layer, and first, second, and third semiconductor layers 54a, 54b, and 54c are formed by photolithography using a first mask.

There are at least two methods for forming the polysilicon layer: a first method of directly depositing a polysilicon layer and a second method of depositing an amorphous silicon layer and crystallizing the deposited amorphous silicon layer to a polysilicon layer.

The first method includes an LPCVD (low pressure chemical vapor deposition) method, and a PECVD (plasma enhanced chemical vapor deposition) method. In the LPCVD method, the polysilicon layer is deposited at a high temperature above 550° C. In case of the PECVD method, the polysilicon layer is deposited at a temperature below 400° C. by using a mixing gas of $SiF_4/SiH_4/H_2$.

The second method includes an SPC (solid phase crystallization) method of performing a heat treatment at a high temperature for a long time, an ELA (eximer laser annealing) method of irradiating an eximer laser at a temperature of 250° C., and an MIC (metal induced crystallization) method of inducing crystallization by depositing a metal layer on the amorphous silicon layer.

The semiconductor layers 54a, 54b, and 54c are patterned in an island shape. At this time, n-type TFT and p-type TFT regions are respectively formed in the first and third semiconductor layers 54a and 54c, and a storage capacitor is formed in the second semiconductor layer 54b.

Next, as illustrated in FIG. 1B, a second photoresist 31 is coated on an entire surface of the insulating substrate 11, and an exposure and developing process is performed thereon, so that the second photoresist 31 is patterned to cover the first semiconductor layer 54a of the n-type TFT region, and the third semiconductor layer 54c of the p-type TFT region. After that, by performing a storage doping process to the entire surface of the substrate, a storage doping layer is formed in the second semiconductor layer 54b of a storage region.

Subsequently, as illustrated in FIG. 1C, after removing the second photoresist 31, an inorganic insulating layer of silicon oxide $SiO_x$ or silicon nitride $SiN_x$ is deposited on the entire surface of the insulating substrate 11, by PECVD (plasma enhanced chemical vapor deposition), thereby forming a gate insulating layer 13. Thereafter, a low-resistance metal layer, for example, copper Cu, aluminum Al, aluminum molybdenum AlNd, molybdenum Mo, chrome Cr, titanium Ti, tantalum Ta, or molybdenum-tungsten MoW, is deposited on the gate insulating layer 13. Then, after a third photoresist (not shown) is deposited on the low-resistance metal layer, first and second gate electrodes 12 and 22 and a storage electrode 19 are formed in the respective semiconductor layers 54a, 54b, and 54c by photolithography using a third mask. In this state, the first and second gate electrodes 12 and 22 are partially overlapped with first and second channel layers 14 and 24 of the n-type TFT region and the p-type TFT region, and the storage electrode 19 is overlapped with the second semiconductor layer 54b of the storage region.

Next, n-type impurity ions are lightly doped on the semiconductor layers 54a and 54c by using the first and second gate electrodes 12 and 22 as a mask, thereby forming LDD (lightly doped drain) doping layers 88 in the semiconductor layer 54a and 54c at both sides of the first and second gate electrodes 12 and 22. At this time, the remaining portions of the first and second semiconductor layers 54a and 54c, on which the n-type impurity ions are not doped, serve as the first and second channel layers 14 and 24.

As described above, the LDD doping layer is formed by lightly doping the predetermined portions of the semiconductor layer with the impurity ions, whereby it is possible to decrease a turning-off current by decreasing an electric field of a contact region by resistance, and to minimize the decrease of a turning-on current.

After that, as illustrated in FIG. 1D, a fourth photoresist 33 is coated on the entire surface of the substrate including the first gate electrode 12, and then an exposure and developing process using a fourth mask is performed thereon, whereby the fourth photoresist 33 is patterned to expose some of the first semiconductor layer 54 corresponding to the n-type TFT region at both sides of the first gate electrode 12. Accordingly, the p-type TFT region and the storage region are blocked, so that it is possible to prevent the ions from being implanted to the p-type TFT region and the storage region.

Then, the entire surface of the insulating substrate 11 is highly doped with the n-type impurity ions of phosphorous P, thereby forming first source and drain regions 15a and 15b in the n-type TFT region. After that, the first source and drain regions 15a and 15b are activated. After stripping the fourth photoresist 33, as illustrated in FIG. 1E, a fifth photoresist 35 is coated on the entire surface of the substrate including the first and second gate electrodes 12 and 22, and then patterned to expose the p-type TFT region by an exposure and developing process using a fifth mask. As a result, the n-type TFT region and the storage region are blocked, whereby the ions are not implanted thereto.

Subsequently, the p-type impurity ions, such as-boron B, are highly doped on the entire surface of the insulating substrate 11, thereby forming second source and drain regions 25a and 25b in the p-type TFT region. Then, the second source and drain regions 25a and 25b are activated. After stripping the fifth photoresist 35, as illustrated in FIG. 1F, an insulating material such as silicon oxide or silicon nitride is deposited on the entire surface of the substrate including the first gate electrode 12, by PECVD, thereby forming an insulating interlayer 23.

Thereafter, a sixth photoresist (not shown) is coated, and the gate insulating layer 13 and the insulating interlayer 23 are selectively removed to expose predetermined portions of the first and second source/drain regions 15a, 15b, 25a, and 25b by photolithography using a sixth mask, thereby forming a first contact hole 71.

By stripping the sixth photoresist, as illustrated in FIG. 1G, first and second source/drain electrodes 15c, 15d, 25c, and 25d are connected with the first and second source/drain regions 15a, 15b, 25a, and 25b through the first contact hole 71, thereby completing the CMOS-TFT having the n-type TFT and the p-type TFT.

That is, a low-resistance metal layer such as copper Cu, aluminum Al, aluminum neodymium AlNd, molybdenum Mo, chrome Cr, titanium Ti, tantalum Ta, or molybdenum-tungsten MoW, and a seventh photoresist (not shown) are sequentially coated on the entire surface of the substrate including the insulating interlayer 23, to bury the first contact hole 71. Then, the coated low-resistance metal layer is patterned in an exposure and developing process using a seventh mask, thereby forming the first and second source/drain electrodes 15c, 15d, 25c, and 25d.

Accordingly, the n-type TFT is formed in each pixel region to drive the pixel region, wherein the n-type TFT is comprised of the first gate electrode 12, the first source/drain electrodes 15c and 15d, and the first channel layer 14. Also, the p-type TFT is formed in the driving circuit, to apply the signals to the gate and data lines, wherein the p-type TFT is comprised of the second gate electrode 22, the second source/drain electrodes 25c and 25d, and the second channel layer 24. Also, the storage including the second semiconductor layer 54b, the gate insulating layer 13, and the storage electrode 19 is formed in each pixel region.

As illustrated in FIG. 1H, after stripping the seventh photoresist, a photoacryl resin is coated on the entire surface of the substrate including the first source/drain electrodes 15c and 15d, and then an exposure and developing process using an eighth mask is performed thereon, thereby forming a plurality of photoacryl resin patterns at fixed intervals. Then, by reflowing the plurality of photoacryl resin patterns, it is possible to form a plurality of first projection patterns 90. Thus, the plurality of first projection patterns 90 are formed at fixed intervals, wherein each first projection pattern is formed in a spherical shape.

Subsequently, as illustrated in FIG. 1I, an inorganic insulating layer of silicon oxide $SiO_x$ or silicon nitride $SiN_x$ is deposited on the entire surface of the substrate including the first projection patterns 90, or an organic insulating layer of BCB (BenzoCycloButene) or acrylic material is coated on the entire surface of the substrate, thereby forming a passivation layer 16. At this time, the passivation layer 16 is formed along the first projection patterns 90, whereby the passivation layer 16 has a plurality of second projection patterns 92.

Referring to FIG. 1J, the passivation layer 16 and the insulating interlayer 23 are etched to expose the first drain electrode 15d and the storage electrode 19 by photolithography using a ninth mask, thereby forming a second contact hole 81.

Subsequently, as illustrated in FIG. 1K, a metal layer having high reflexibility, for example, aluminum-Al, aluminum neodymium AlNd, or titanium Ti, is deposited on the entire surface of the substrate including the passivation layer 16, and patterned by photolithography using a tenth mask, thereby forming a reflective electrode 17a. The reflective electrode 17a is formed along the second projection patterns 92, whereby the reflective electrode 17a has reflective projections. If the ambient light is used as the light source, the reflective projections partially changes reflection angle of the ambient light, thereby obtaining a great amount of reflective light.

As illustrated in FIG. 1L, ITO (indium-tin-oxide) or IZO (indium-zinc-oxide) is deposited on the entire surface of the substrate including the reflective electrode 17a, and then patterned by photolithography using an eleventh mask, thereby forming a transmitting electrode 17b. At this time, the reflective electrode 17a is formed in the reflective part of the pixel region, and the transmitting electrode 17b is formed in the transmitting part of the pixel region. However, the transmitting electrode 17b is in contact with the predetermined portion of the reflective electrode 17a, to receive the voltage.

Accordingly, the related art fabrication process of the TFT array substrate totally uses a mask eleven times.

Although not shown, the CMOS-TFT array substrate having the n-type TFT and the p-type TFT is maintained at a predetermined interval from a facing substrate having a color filter layer by spacers, and then the two substrates are bonded to each other by sealant. Then, a liquid crystal layer is formed by injecting liquid crystal between the two substrates, and an inlet for injection of liquid crystal is sealed, thereby completing the LCD device.

SUMMARY OF THE INVENTION

Accordingly, the present invention is directed to a CMOS-TFT array substrate and a method for fabricating the same that substantially obviates one or more problems due to limitations and disadvantages of the related art.

An advantage of the present invention is to provide a CMOS-TFT array substrate and a method for fabricating the same by a low-mask technology to decrease the usage count of masks, thereby decreasing the fabrication cost and time, and simplifying the fabrication process steps.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a transflective type LCD device includes a substrate comprising an active area having a plurality of pixel regions and a driving circuit area for driving the active area, each pixel region having a transmitting part and a reflective part; a first semiconductor layer having first source/drain regions formed in the pixel region; a second semiconductor layer having second source/drain regions formed in the driving circuit area; a gate insulating layer on an entire surface of the substrate including the first and second semiconductor layers; first and second gate electrodes on the gate insulating layer above the first and second semiconductor layers; a storage electrode in the pixel region; an insulating interlayer on the entire surface of the substrate; a transmitting electrode on the insulating interlayer of the transmitting part; a passivation layer on the entire surface of the substrate including the transmitting electrode; a reflective electrode on the passivation layer of the reflective part; first and second source/drain electrodes being in contact with the first and second source/drain regions; and a liquid crystal layer between the substrate and another facing substrate.

In another aspect, a method for fabricating a transflective type LCD device includes the steps of forming a semiconductor layer on an insulating substrate; forming a gate insulating layer on an entire surface of the substrate including the semiconductor layer; forming a gate electrode and a storage electrode on the gate insulating layer; forming source/drain regions by implanting impurity ions to the semiconductor layer with the gate electrode as a mask; forming an insulating interlayer on the entire surface of the substrate including the gate electrode; forming a transmitting electrode on the insulating interlayer; forming a passivation layer having a projection pattern on the entire surface of the substrate including the transmitting electrode; forming a contact hole and an open area to expose the source/drain regions and the transmitting electrode; and forming source/drain electrodes being in contact with the source/drain regions through the contact hole, and a reflective electrode being in contact with the transmitting electrode through the open area.

As compared with the related art fabrication process using the mask eleven times, the fabrication process according to the present invention uses the mask seven times, thereby decreasing the fabrication process time and improving efficiency in mass production.

By the gate etch back technology, it is possible to perform the process of highly doping the n-type impurity ions, of lightly doping the n-type impurity ions, and of counter-doping, together, with one mask.

Also, the lower electrode of the storage capacitor is formed together with the gate electrode, and the upper electrode of the storage capacitor is formed of the transmitting electrode, whereby it is possible to decrease the usage count of mask one time.

In addition, the source/drain electrodes and the reflective electrode are formed at the same time, thereby decreasing the usage count of mask one time.

Meanwhile, an array substrate having various thin film transistors is divided into an active area and a driving circuit area. The active area includes a data line for transmitting a video signal; a gate line for transmitting a scanning signal and formed in perpendicular to the data line to define a pixel region; a thin film transistor for driving a pixel formed at a crossing point of the gate and data lines, and comprising a first gate electrode, first source/drain electrodes, and a first channel layer; a reflective electrode being in contact with the thin film transistor for driving a pixel, and having a plurality of reflective projections; a transmitting electrode connected with the thin film transistor for driving a pixel by the reflective electrode; and a storage capacitor formed in a predetermined portion of the pixel region, and having a storage electrode and the transmitting electrode. Also, the driving circuit area includes a thin film transistor for a driving circuit, to apply a voltage to the pixel regions by the gate and data lines extended from the active area, wherein the thin film transistor for a driving circuit includes a second gate electrode, second source/drain electrodes, and a second channel layer.

At this time, the thin film transistor for driving a pixel is formed of n-type TFT of high speed operation, and the thin film transistor for a driving circuit is formed of p-type TFT of low power consumption, thereby completing a CMOS-TFT.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Hereinafter, a transflective type liquid crystal display (LCD) device according to the present invention and a method for fabricating the same will be described with reference to the accompanying drawings.

In a transflective type LCD device according to a first embodiment of the present invention, a passivation layer and a hemispherical projection pattern are formed as one of an organic insulating layer.

Figure 1A:
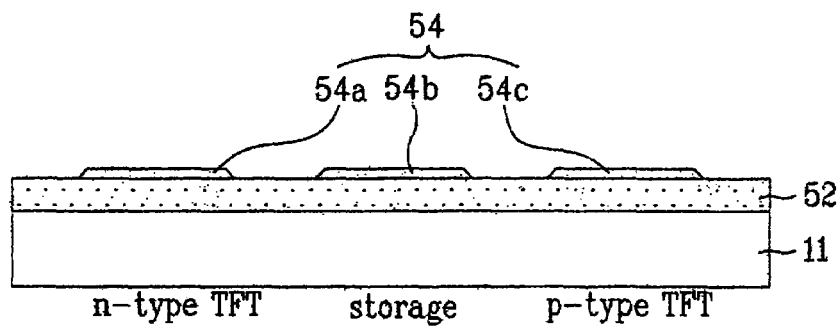
FIG. 1A to FIG. 1L illustrate cross sectional views of a transflective type LCD device according to the related art.
Figure 1B:
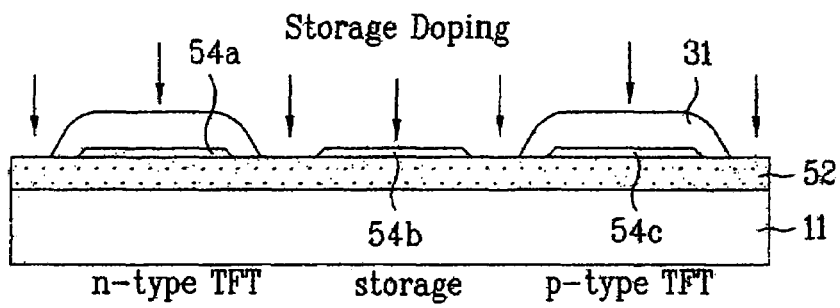
Figure 1C:
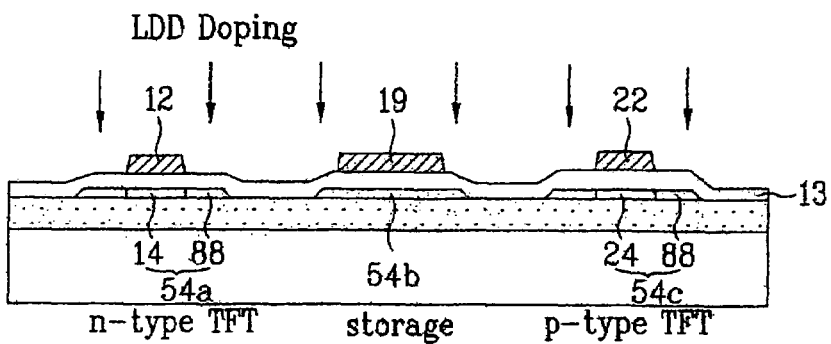
Figure 1D:
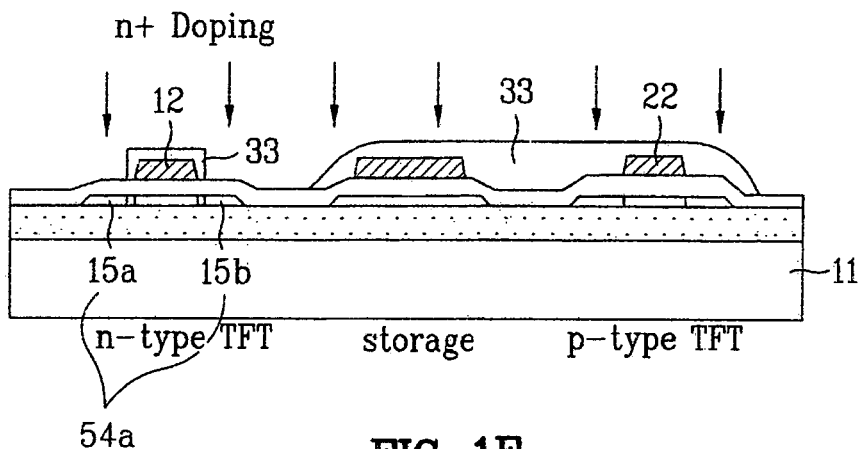
Figure 1E:
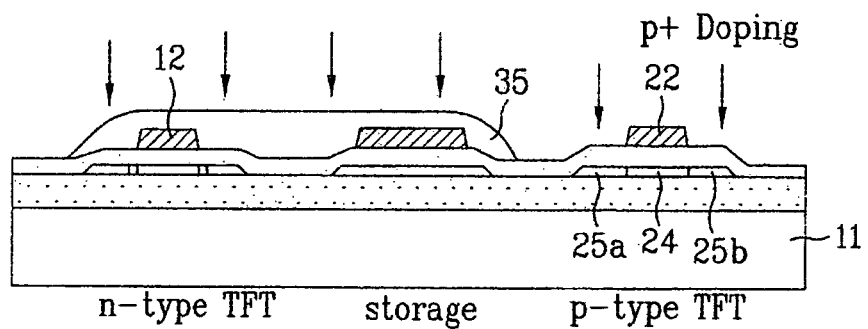
Figure 1F:
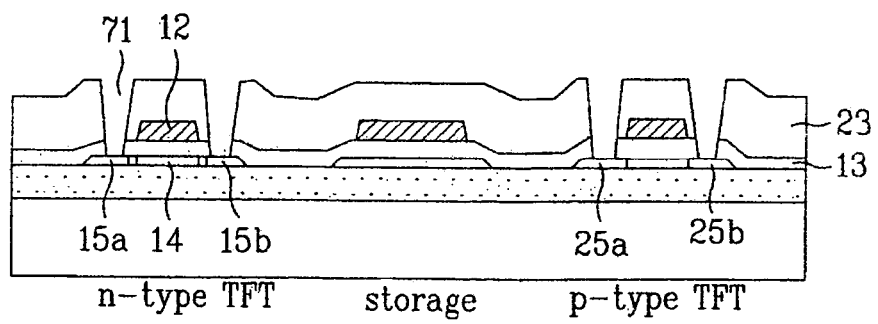
Figure 1G:
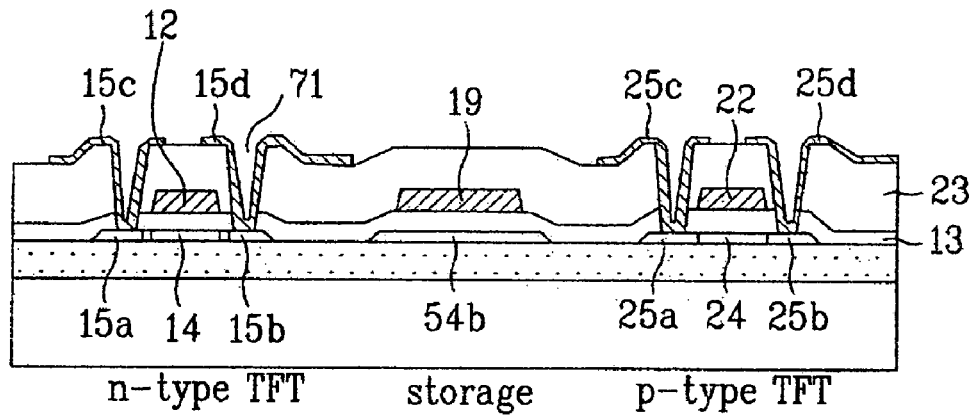
Figure 1H:
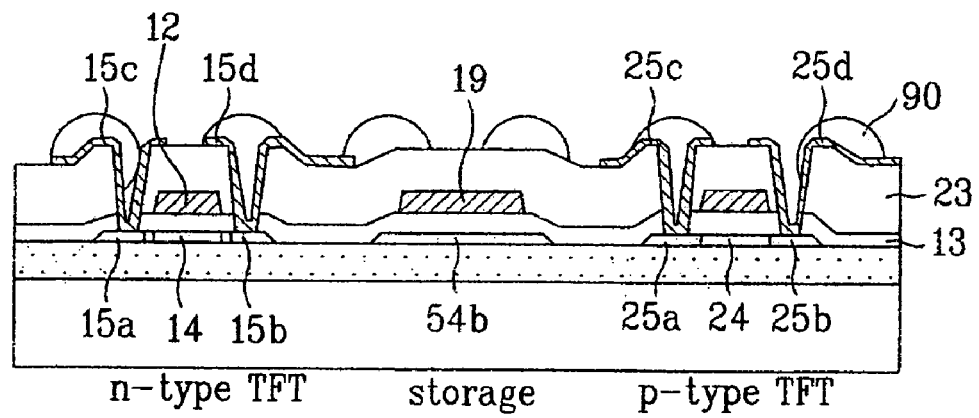
Figure 1I:
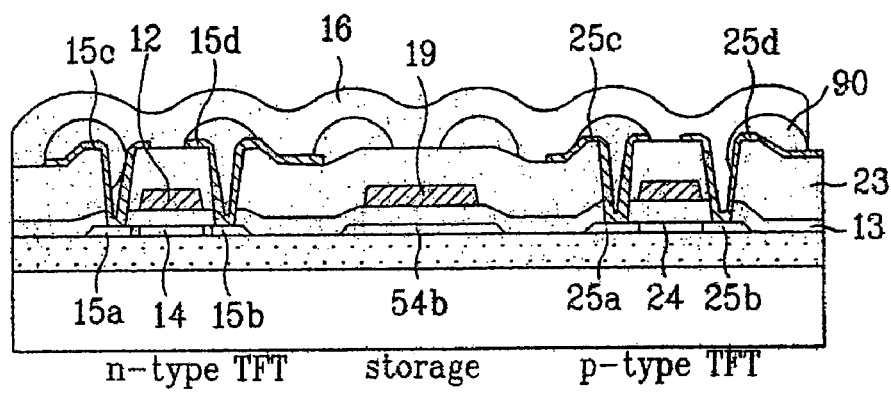
Figure 1J:
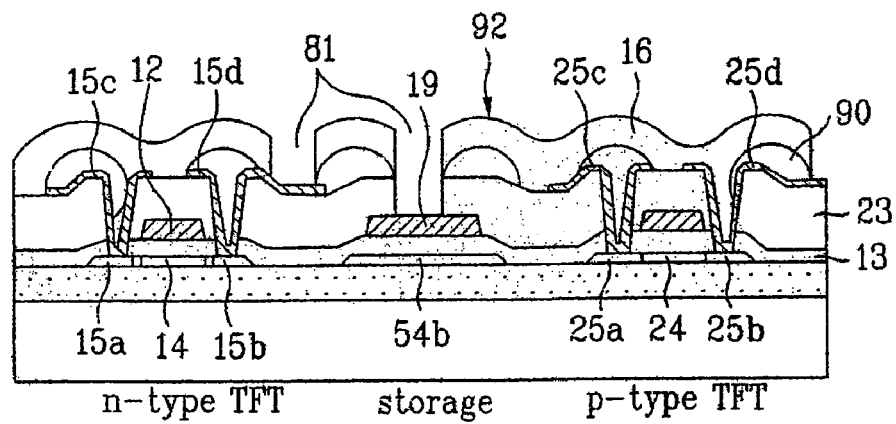
Figure 1K:
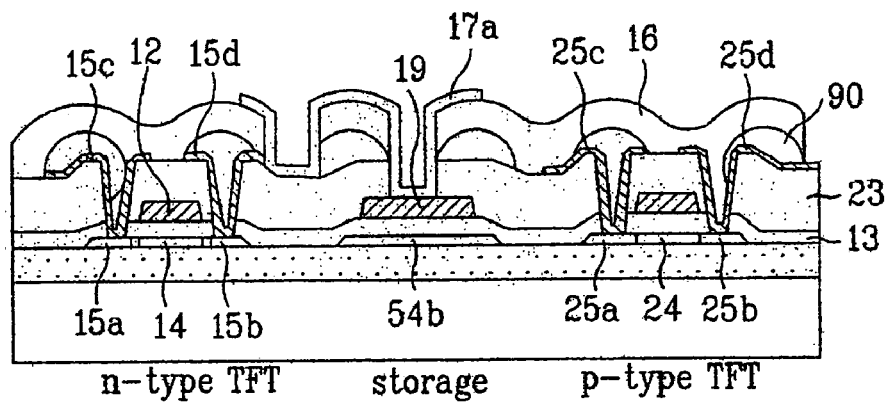
Figure 1L:
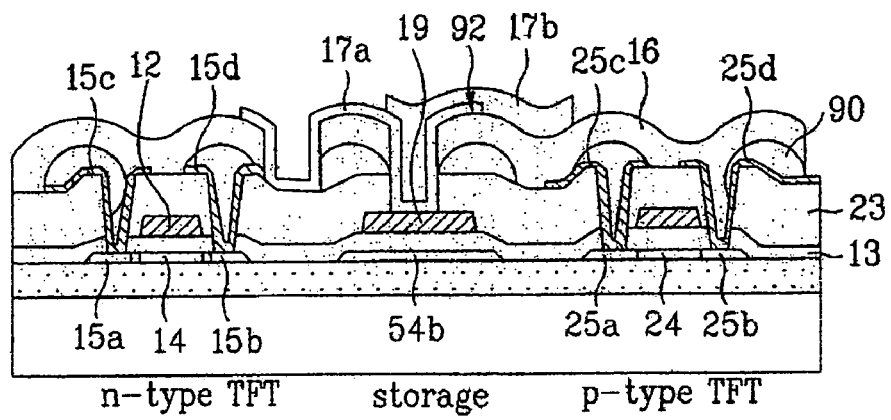
Figure 2:
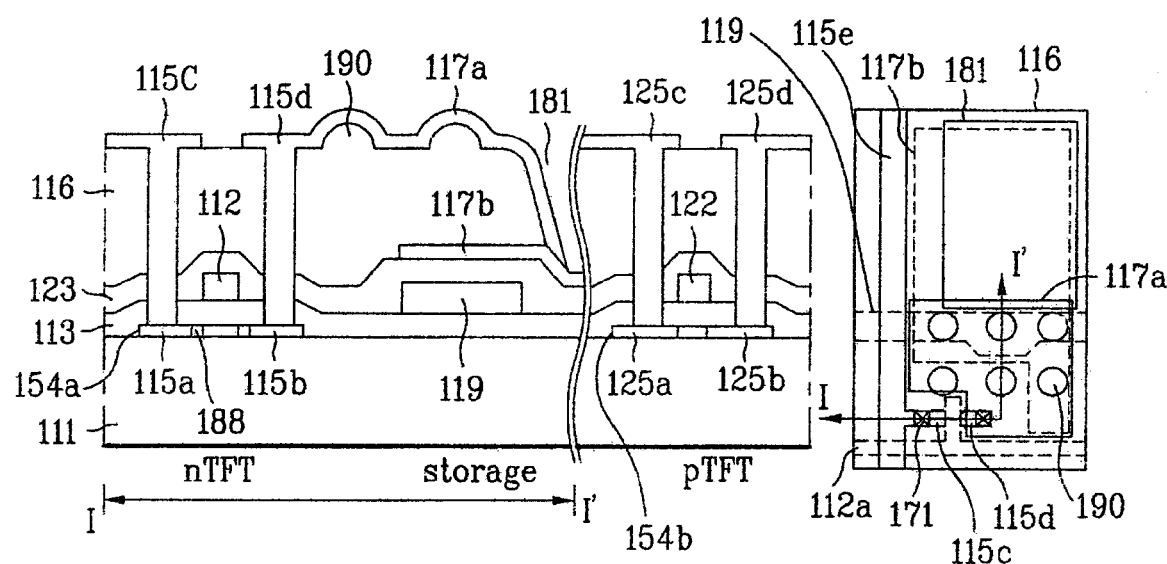
FIG. 2 illustrates a cross sectional view of a transflective type LCD device according to the first embodiment of the present invention, also, a cross sectional view along I-I'.

FIG. 2 illustrates a cross sectional view of a transflective type LCD device according to the first embodiment of the present invention, also, a cross sectional view along I-I'. FIG. 3A to FIG. 3I illustrate cross sectional views of a method for fabricating a transflective type LCD device according to the first embodiment of the present invention, also, plane views along I-I'. In FIG. 2 and FIG. 3A to FIG. 3I, the transflective type LCD device is explained by dividing an active area and a driving circuit area, wherein only active area is shown as the plane view.

First, in the transflective type LCD device according to the first embodiment of the present invention, as illustrated in FIG. 2, a TFT array substrate includes an active area (I-I') and a driving circuit area, wherein the active area has n-type TFTs in respective pixel regions to display images, and the driving circuit area has both n-type TFT and p-type TFT to drive the active area. At this time, each pixel region of the active area is divided into a reflective part and a transmitting part, whereby it is possible to use ambient light or light emitted from a backlight as a light source.

In the active area, there are a first semiconductor layer 154a, a gate insulating layer 113, a gate line 112a, a first gate electrode 112, a storage electrode 119, an insulating interlayer 123, a transmitting electrode 117b, a passivation layer 116, first source and drain electrodes 115c and 115d, a data line 115e, and a reflective electrode 117a. At this time, the first semiconductor layer 154a has first source and drain regions 115a and 115b, and the gate insulating layer is formed on an entire surface of an insulating substrate 111 including the first semiconductor layer 154a. Also, the gate line 112a is formed on the gate insulating layer 113 along one direction, and the first gate electrode 112 diverged from the gate line 112a is overlapped with the first semiconductor layer 154a. Then, the storage electrode 119 is formed on the same layer as the gate line 112a in substantial parallel, wherein the storage electrode 119 serves as a capacitor lower electrode. The insulating interlayer 123 is formed on the entire surface of the insulating substrate 111 including the gate line 112a, and the transmitting electrode 117b is formed in a transmitting part of the insulating interlayer 123. Also, the passivation layer 116 is formed on the entire surface of the insulating substrate 111 including the transmitting electrode 117b, and a projection pattern 190 is formed on the surface of the passivation layer 116 as one. In addition, the first source and drain electrodes 115c and 115d are in contact with the first source and drain regions 115a and 115b in the passivation layer. The data line 115e is formed as one with the first source electrode 115c, and the data line 115e is formed substantially perpendicular to the gate line 112a. Also, the reflective electrode 117a is formed as one with the first drain electrode 115d in a reflective part of the passivation layer 116, wherein the reflective electrode 117a has a reflective projection along the projection pattern 190, and the reflective electrode 117a is in contact with the transmitting electrode 117b in an open area 181 of the transmitting part.

In this example, the first source and drain regions 115a and 115b are doped with n-type impurity ions, and the n-type TFT is comprised of the first semiconductor layer 154a, the gate insulating layer 113, the first gate electrode 112, and the first source and drain electrodes 115c and 115d. Furthermore, an LDD doping layer 188 is formed inside the first source and drain regions 115a and 115b.

The transmitting electrode 117b is overlapped with the storage electrode 119, whereby the transmitting electrode 117b serves as a capacitor upper electrode. Thus, a storage capacitor is comprised of the storage electrode 119, the transmitting electrode 117b, and the insulating interlayer 123 interposed between the storage electrode 119 and the transmitting electrode 117b.

By removing the passivation layer 116 corresponding to the transmitting part, the passivation layer 116 has the open area 181 of the transmitting part. In this case, the passivation layer 116 is formed at a thickness corresponding to a cell gap of the liquid crystal cell, and is removed in the transmitting part, thereby forming the open area 181 of the transmitting part. Accordingly, the transmitting electrode 117b of the transmitting part is positioned lower than the reflective electrode 117a of the reflective part, at a range corresponding to the cell gap of the liquid crystal cell.

The driving circuit area has the p-type TFT as well as the aforementioned n-type TFT. The p-type TFT is comprised of a second semiconductor layer 154b, a gate insulating layer 113, a second gate electrode 122, and second source/drain electrodes 125c/125d. At this time, the second semiconductor layer 154b has second source/drain regions 125a/125b doped with p-type impurity ions, and the gate insulating layer 113 is formed on the second semiconductor layer 154b. Then, the second gate electrode 122 is formed on the gate insulating layer 113. Also, the second source/drain electrodes 125c/125d are insulated from the second gate electrode 122, and are in contact with the second source/drain regions 125a/125b.

A method for fabricating the transflective type LCD device according to the first embodiment of the present invention will be described as follows.

Figure 3A:
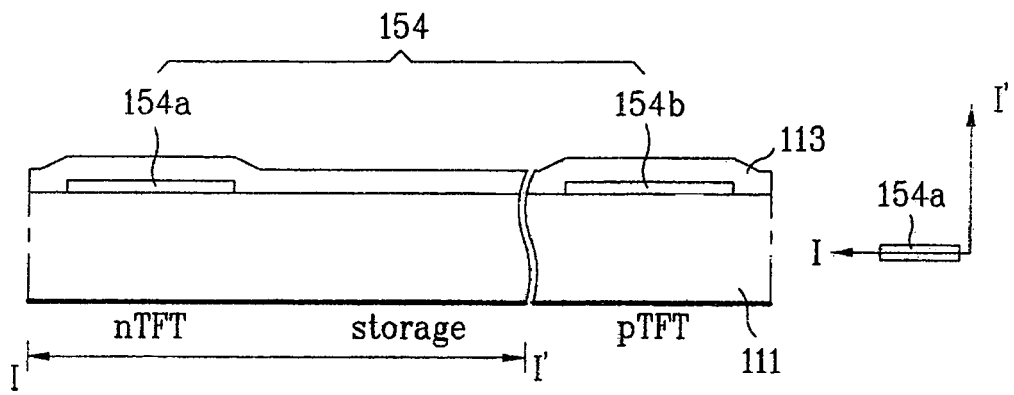
FIG. 3A to FIG. 3I illustrate cross sectional views of a method for fabricating a transflective type LCD device according to the first embodiment of the present invention, also, plane views along I-I'.

First, as illustrated in FIG. 3A, an amorphous silicon is deposited on the insulating substrate 111 by PECVD method using a mixing gas of $SiH_4$ and $H_2$. Then a heat treatment, for example, irradiation of laser beam, is performed, whereby the amorphous silicon is crystallized to a polysilicon. After that, the first and second semiconductor layers 154a and 154b are patterned in an island (isolated) shape by photolithography using a first photoresist and a first mask. At this time, the first semiconductor layer 154a is formed at a portion for the n-type TFT, and the second semiconductor layer 154b is formed at a portion for the p-type TFT.

Although not shown, before forming the semiconductor layer 154, a buffer layer (not shown) may be formed on the insulating substrate 111 by CVD method. The buffer layer may be formed of an insulating material such as silicon oxide $SiO_x$ or BCB, to prevent foreign matter from penetrating into the semiconductor layer 154, to protect the insulating substrate 111 from a high temperature during a crystallization process of the amorphous silicon layer, and to improve the contact characteristics of the semiconductor layer 154 to the insulating substrate 111.

After that, an inorganic insulating material such as silicon oxide $SiO_x$ or silicon nitride $SiN_x$ is formed on the entire surface of the insulating substrate 111 including the semiconductor layer 154 by PECVD method, thereby forming the gate insulating layer 113.

Figure 3B:
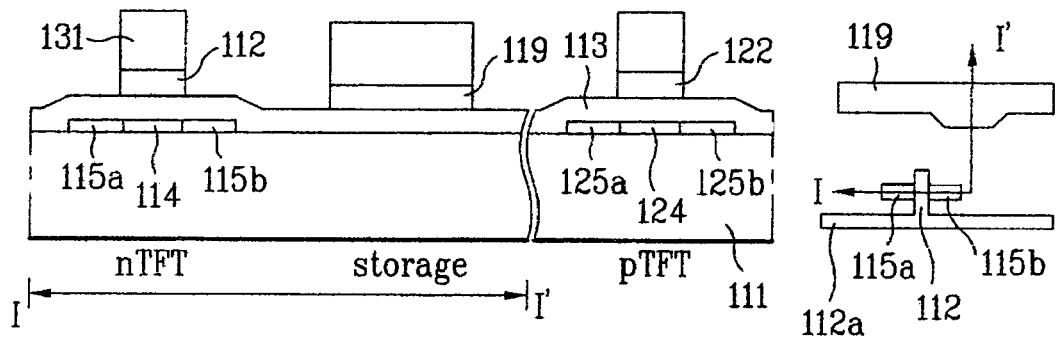

Then, as illustrated in FIG. 3B, a low-resistance metal layer, for example, copper Cu, aluminum Al, aluminum neodymium AlNd, molybdenum Mo, chrome Cr, titanium Ti, tantalum Ta, or molybdenum-tungsten MoW, is deposited on the gate insulating layer 113, and a second photoresist 131 is coated thereon. After patterning the second photoresist 131 by an exposure and development process using a second mask, the low-resistance metal layer is etched, thereby forming the first and second gate electrodes 112 and 122 and the storage electrode 119. At this time, the first and second gate electrodes 112 and 122 are formed with the gate line 112a for transmitting scanning signals, at the same time.

Figure 3C:
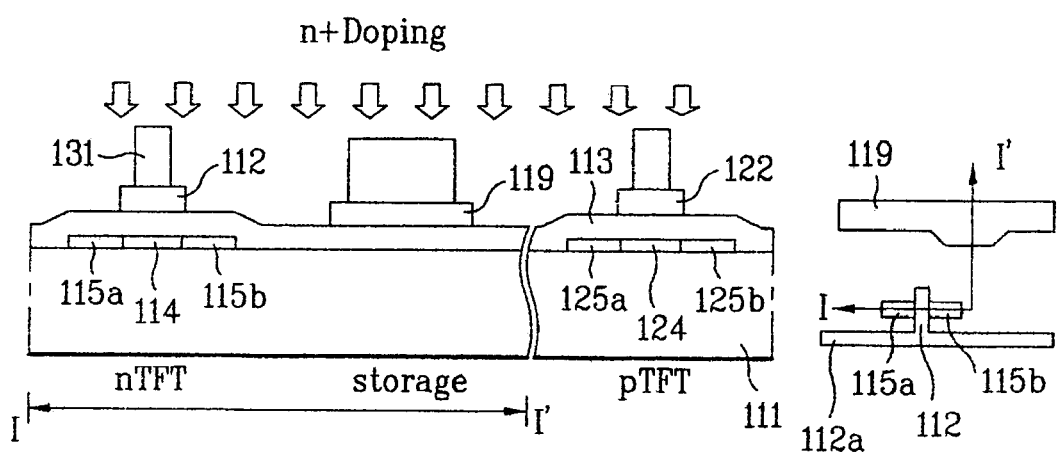

Referring to FIG. 3C, by ashing the second photoresist 131, the second photoresist 131 is decreased to have a smaller width than the gate electrode. Then, highly doped n-type impurity ions are implanted to the first and second semiconductor layers 154a and 154b by using the decreased second photoresist 131 and the first and second gate electrodes 112 and 122 as a mask. That is, by doping phosphorous ions P or arsenic ions As, it is possible to form the first and second source/drain regions 115a, 115b, 125a, and 125b, the n-type doping layer, in the n-type TFT region and the p-type TFT region. After that, the first source/drain regions 115a/115b are activated.

At this time, predetermined portions of the first and second semiconductor layers 154a and 154b, which are not doped with the n-type impurity ions, serve as first and second channel layers 114 and 124. Meanwhile, the n-type doping layer, formed by implanting the ions to the p-type TFT region, is changed to the p-type doping layer by implanting the p-type impurity ions thereto.

Figure 3D:
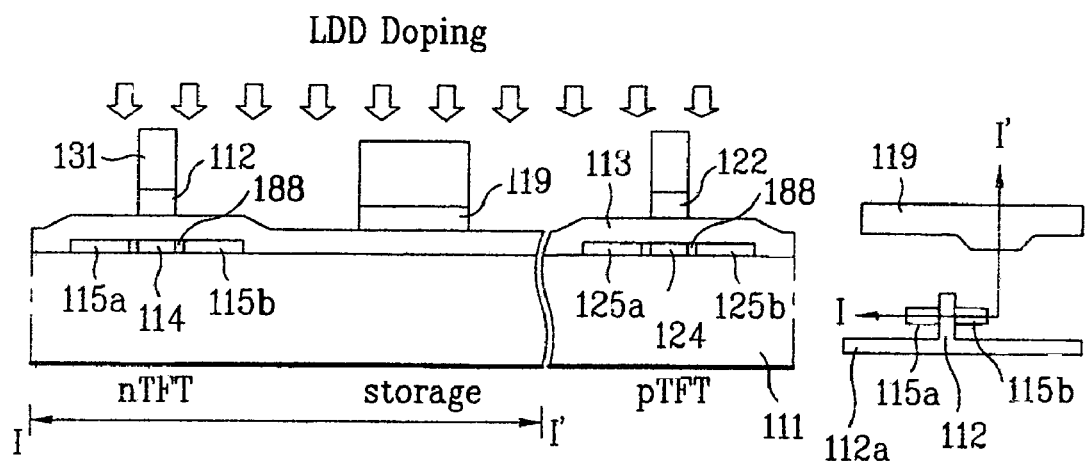

Next, as illustrated in FIG. 3D, the first and second gate electrodes 112 and 122 are etched from sidewalls thereof by etch-back technology using the decreased second photoresist 131 as a mask. At this time, the etched portion of the first and second gate electrodes 112 and 112 by etch-back technology is formed to the LDD doping layer 188. Subsequently, the n-type impurity ions are lightly doped by using the first and second gate electrodes 112 and 122 having the etched sidewalls thereof as a mask. The LDD doping layer 188 of the n-type doping layer is formed inside the first and second source/drain regions 115a, 115b, 125a and 125b of the n-type doping layer adjacent to the first and second gate electrodes 112 and 122, whereby the LDD doping layer 188 decreases a turning-off current by decreasing an electric field of a contact region.

Figure 3E:
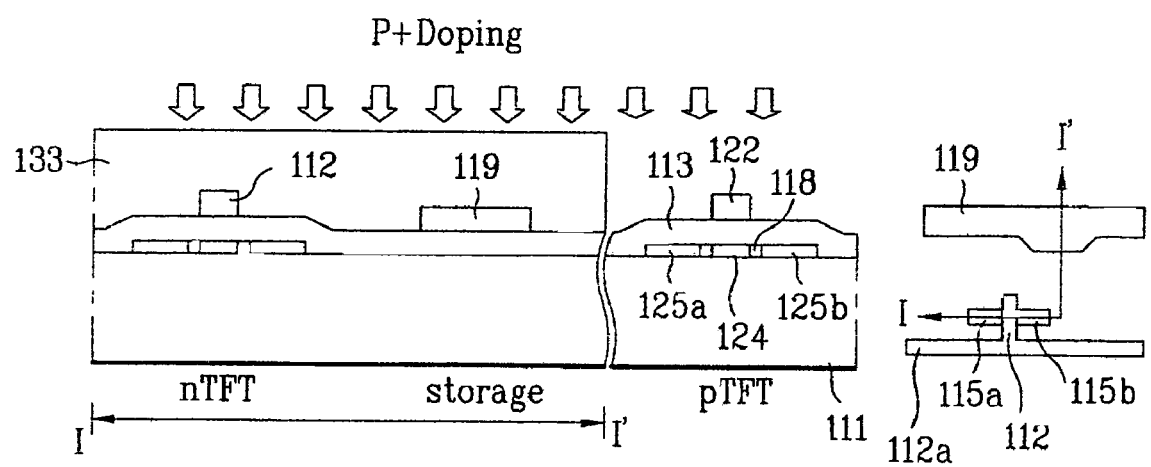

Subsequently, as illustrated in FIG. 3E, the second photoresist 131 is stripped, and a third photoresist 133 is coated on the entire surface of the substrate including the first and second gate electrodes 112 and 122 and the storage electrode 119. After that, the third photoresist 133 is patterned to expose the p-type TFT region by an exposure and development process using a third mask. Then, the entire surface of the substrate 111 is counter-doped with the p-type impurity ions such as boron B ions or $BF_2$ ions, to change the second source/drain regions 125a and 125b of the p-type TFT region to the p-type. After that, the second source/drain regions 125a and 125b are activated. At this time, the undoped second semiconductor layer 154b serves as the second channel layer 124, and the ions are not implanted in the remaining portion blocked by the third photoresist 133. The counter-doping is opposite to the LDD ions implantation type, wherein the ions are doped at a predetermined angle to strengthen the doping intensity of the LDD region of the substrate. Thus, the counter-doping for the LDD ions implantation is carried out to solve the problem of punch-through phenomenon. The punch-through phenomenon is generated by a short channel effect in which the size of device decreases as the integration of device increases, so that it is difficult to operate the device stably for a long time due to large internal electric field.

Figure 3F:
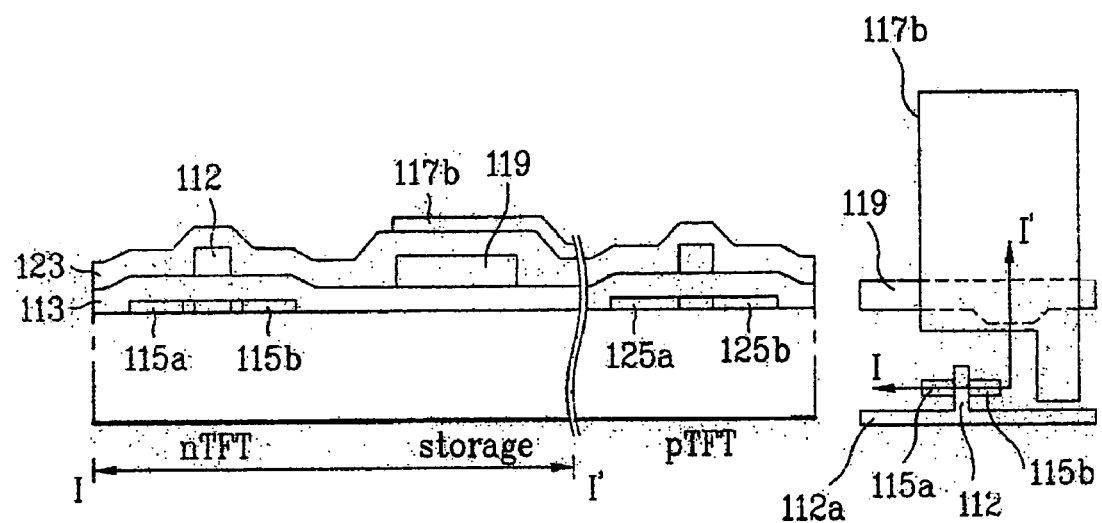

After that, the third photoresist 133 is stripped, as illustrated in FIG. 3F, and an insulating material such as silicon oxide or silicon nitride is deposited on the entire surface of the substrate including the first gate electrode 112 by PECVD, thereby forming the insulating interlayer 123. Then, a transparent conductive material such as ITO or IZO is deposited on the entire surface of the substrate including the insulating interlayer 123, and then patterned by photolithography using a fourth mask, thereby forming the transmitting electrode 117b.

At this time, the storage capacitor includes the transmitting electrode 117 overlapped with the storage electrode 119, the storage electrode 119, and the insulating interlayer 123 interposed between the transmitting electrode 117 and the storage electrode 119. Thus, additional processes for forming the storage capacitor are not required.

Figure 3G:
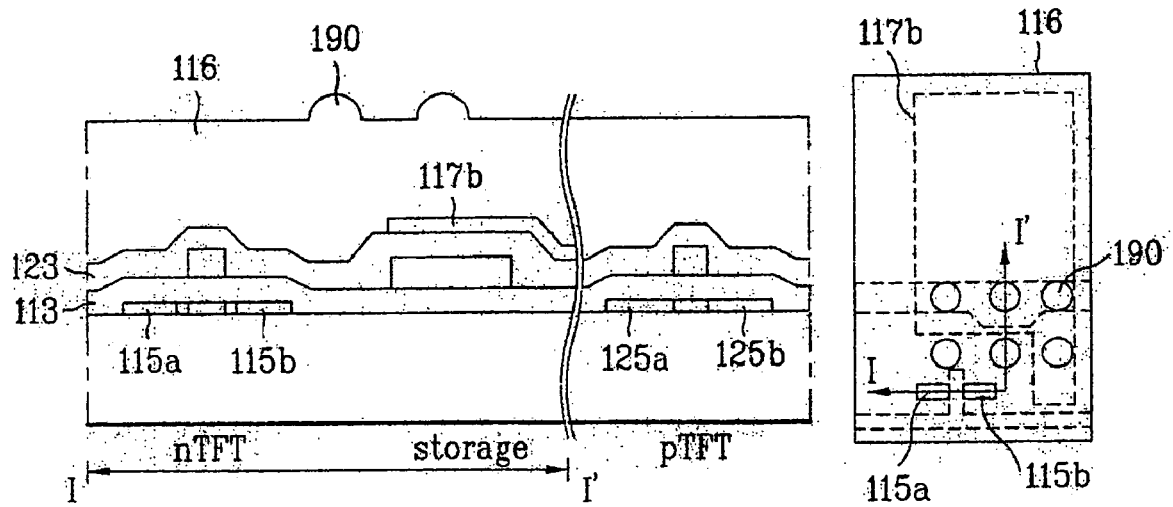

Referring to FIG. 3G, a organic material(e.x., photoacryl resin and BCB) is thickly coated on the entire surface of the substrate including the transmitting electrode 117b, and the passivation layer 116 and the projection pattern 190 are formed as one by photolithography using a fifth mask. The passivation layer 116 has a thickness corresponding to cell gap of liquid crystal. At this time, in order to form the passivation layer 116 and the projection pattern 190 at the same time, it is possible to form the projection pattern by performing a diffraction exposure process, or by depositing a negative type photoacryl resin and a positive photoacryl resin, and etching only the positive photoacryl resin. The plurality of projection patterns 190 are formed at fixed intervals, and each projection pattern 190 is formed in substantially circular or hemispherical shape. At this time, it is possible to reflow the organic material pattern by the ashing process for a predetermined time period, to control curvature of the projection pattern 190.

Figure 3H:
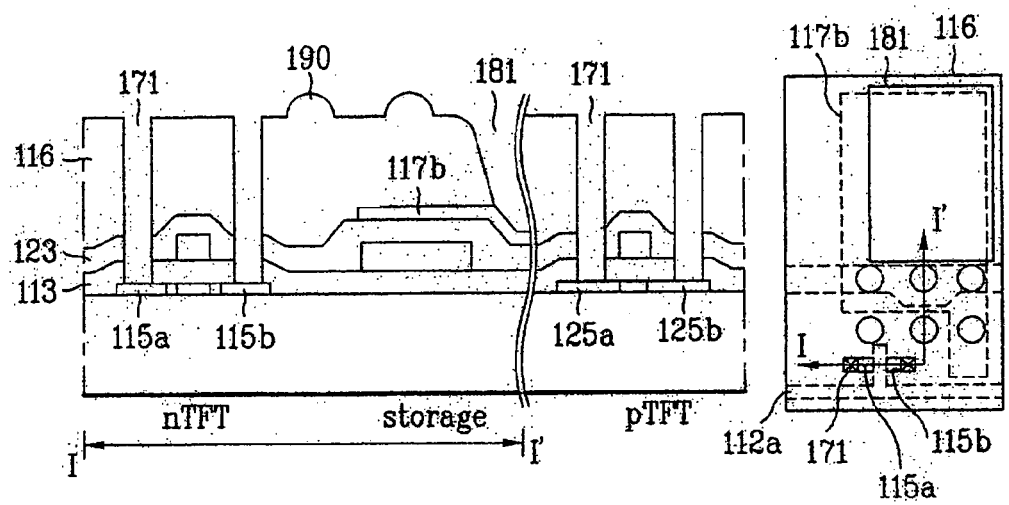

As illustrated in FIG. 3H, the predetermined portions of the gate insulating layer 113, the insulating interlayer 123, and the passivation layer 116 are removed by photolithography using a sixth mask, thereby forming a first contact hole 171 for exposing the first and second source/drain regions 115a, 115b, 125a, and 125b of the n-type TFT and p-type TFT regions. Simultaneously, the open area 181 of the transmitting part for exposing most of the transmitting electrode 117*b* is formed by removing the predetermined portion of the passivation layer 116. Because of the passivation layer 116, the liquid crystal cell gap of the transmitting part is twice as large as the liquid crystal cell gap of the reflective part, to obtain the uniformity of light efficiency in the reflective part and the transmitting part.

Meanwhile, the dry-etching method is generally used to etch the gate insulating layer 113, the insulating interlayer 123, and the passivation layer 116. In the dry-etching method, gases are sprayed into an etching chamber at a high vacuum state, and the desired portion of the layer is etched by positive ions or radical. The dry-etching method is generally used for etching the insulating layer, which has the great accuracy of pattern.

The dry-etching method is categorized into PE (plasma etching), RIE (reactive ion etching), MERIE (magnetically enhanced reactive ion etching), ECR (electron cyclotron resonance), and TCP (transformer coupled plasma), wherein PE and RIE modes are most generally used for the fabrication process of the LCD device.

Figure 3I:
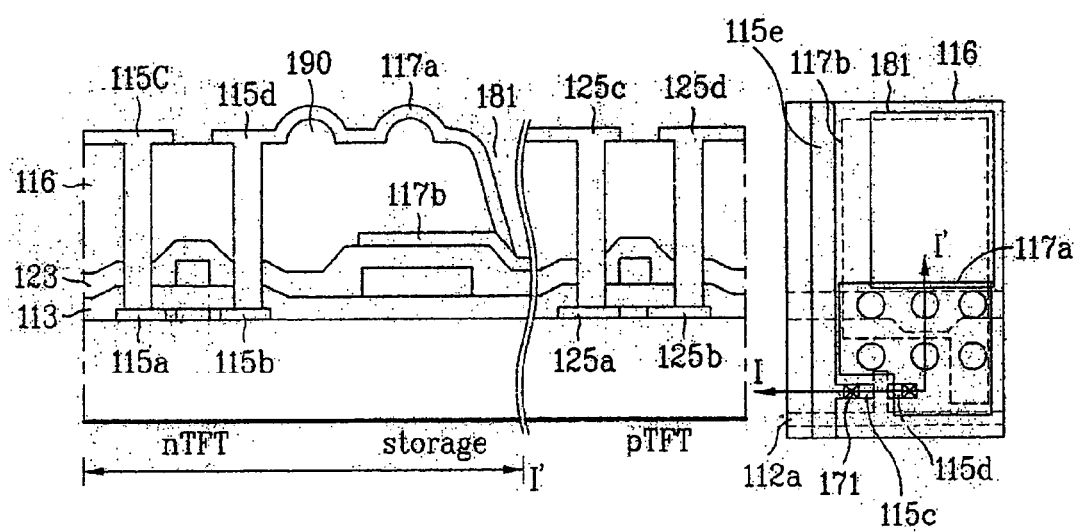

As illustrated in FIG. 3I, a low-resistance metal layer having high reflexibility is formed on the passivation layer 116 having the projection pattern 190 formed thereon, and then patterned by photolithography using a seventh mask, thereby forming the first and second source/drain electrodes 115*c*, 115*d*, 125*c*, and 125*d* and the reflective electrode 117*a* at the same time.

The reflective electrode 117*a* is in contact with the transmitting electrode 117*b* through the open area 181 of the transmitting part, and the reflective electrode 117*a* is formed along the surface of the projection pattern 190. As a result, the reflective electrode 117*a* has the plurality of hemispherical reflective projections. In case the ambient light is used as the light source, the reflective projections partially change the reflection angle of ambient light, thereby widening the viewing angle by obtaining a great amount of reflective light.

The metal layer is formed of copper Cu, aluminum Al, aluminum neodymium AlNd, molybdenum Mo, chrome Cr, titanium Ti, tantalum Ta, molybdenum-tungsten MoW or the like. The data line 115*e* is formed at the same time as the first source/drain electrodes 115*c* and 115*d*. The gate and data lines 112*a* and 115*e* are formed substantially perpendicular to each other, to define the pixel region.

Also, the first and second source/drain electrodes 115*c*, 115*d*, 125*c*, and 125*d* are in contact with the first and second source/drain regions 115*a*, 115*b*, 125*a*, and 125*b*. The first source electrode 115*c* is formed as one with the data line 115*e*, and the first drain electrode 115*d* is formed as one with the reflective electrode 117*a*. By forming the source/drain electrodes and the reflective electrode at the same time, it is possible to reduce the usage count of the mask by one.

Accordingly, it is possible to complete the CMOS thin film transistor including the n-type TFT and the p-type TFT, wherein the n-type TFT is formed in each pixel region, to drive the pixel region, and has the first gate electrode 112, the first source/drain electrodes 115*c* and 115*d*, and the first channel layer 114, and the p-type TFT is formed in the driving circuit area, to apply signals to the gate and data lines, and has the second gate electrode 122, the second source/drain electrodes 125*c* and 125*d*, and the second channel layer 124. The fabrication process of the CMOS-TFT array substrate including the n-type TFT and the p-type TFT totally uses a mask seven times.

In a transflective type LCD device according to a second embodiment of the present invention, after a spherical projection pattern (e.g., having a substantially sperical arced surface) is formed of an organic insulating layer, another organic insulating layer is formed on the spherical projection pattern. Accordingly, the transflective type LCD device according to the second embodiment of the present invention has the similar structure as that of the LCD device according to the first embodiment of the present invention except that the organic insulating layer is formed on the projection pattern.

Figure 4:
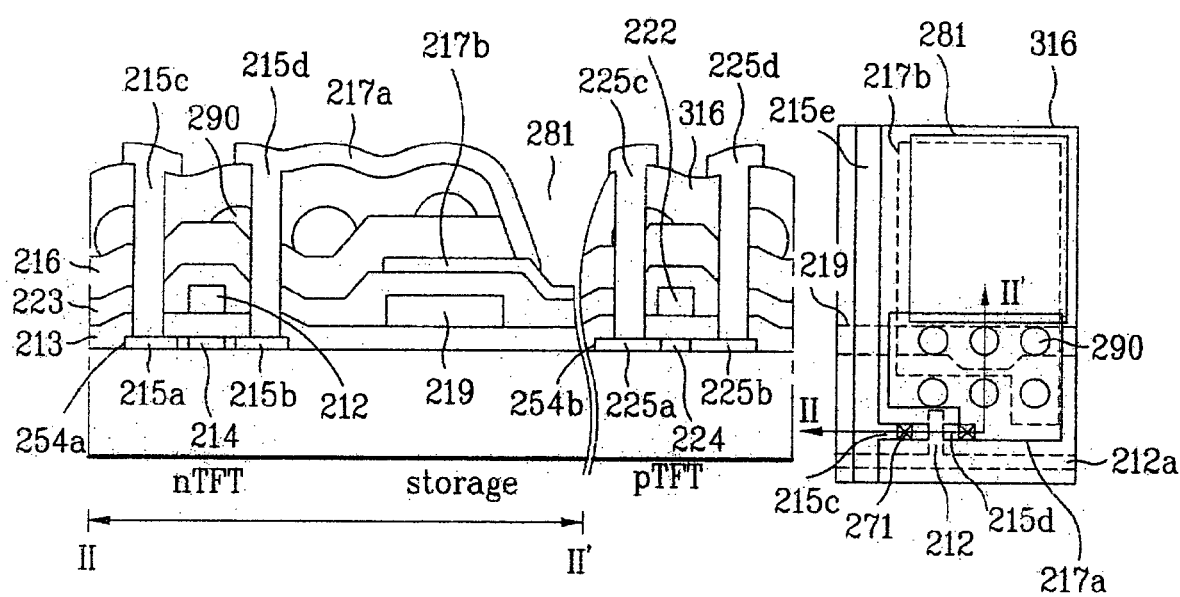
FIG. 4 illustrates a cross sectional view of a transflective type LCD device according to the second embodiment of the present invention, also, a cross sectional view along II-II'.

FIG. 4 illustrates a cross sectional view of a transflective type LCD device according to the second embodiment of the present invention, also, a cross sectional view along II-II'. FIG. 5A to FIG. 5J are cross sectional views of a method for fabricating a transflective type LCD device according to the second embodiment of the present invention, also, plane views along II-II'.

In FIG. 4 and FIG. 5A to FIG. 5J, the transflective type LCD device is explained in state of dividing an active area (II-II') and a driving circuit area, wherein only active area is shown as the plane view.

First, in the transflective type LCD device according to the second embodiment of the present invention, as illustrated in FIG. 4, a TFT array substrate includes an active area (II-II') and a driving circuit area, wherein the active area has n-type TFTs in respective pixel regions to display images, and the driving circuit area has both n-type TFT and p-type TFT to drive the active area.

More specifically, there are first and second semiconductor layers 254*a* and 254*b*, a gate insulating layer 213, a gate line 212*a*, first and second gate electrodes 212 and 222, a storage electrode 219, an insulating interlayer 223, a transmitting electrode 217*b*, a passivation layer 216, a projection pattern 290, an organic insulating layer 316, first and second source/drain electrodes 215*c*, 215*d*, 225*c*, and 225*d*, a data line 215*e*, and a reflective electrode 217*a*. At this time, the first and second semiconductor layers 254*a* and 254*b* respectively have first and second source/drain regions 215*a*, 215*b*, 225*a*, and 225*b*. Then, the gate insulating layer 213 is formed on an entire surface of the substrate including the first and second semiconductor layers 254*a* and 254*b*. Also, the gate line 212*a* is formed on the gate insulating layer 213, and the first and second gate electrodes 212 and 222, diverged from the gate line 212*a*, are respectively overlapped with the first and second semiconductor layers 254*a* and 254*b*. The storage electrode 219 is formed on the same layer as the gate line 212*a* substantially parallel with the gate line 212*a*, and the insulating interlayer 223 is formed on the entire surface of the substrate including the gate line 212*a*. Then, the transmitting electrode 217*b* is formed in a transmitting part of the insulating interlayer 223. The passivation layer 216 is formed on the entire surface of the substrate including the transmitting electrode 217*b*, and the projection pattern 290 is formed on the surface of the passivation layer 216. Also, the organic insulating layer 316 such as BCB or acryl resin is formed on the entire surface of the substrate to control curvature of the projection pattern 290. The first and second source/drain electrodes 215*c*, 215*d*, 225*c*, and 225*d* are in contact with the first and second source/drain regions 215*a*, 215*b*, 225*a*, and 225*b* of the organic insulating layer 316. After that, the data line 215*e* is formed substantially perpendicular to the gate line 212*a*, and the data line 215*e* is formed as one with the first source electrode 215*c*. The reflective electrode 217*a* is formed as one with the first drain electrode 215*d* in a reflective part of the passivation layer 216, and the reflective electrode 217*a* has a reflective projection along the projection pattern 290.

At this time, the first source/drain regions 215*a* and 215*b* are doped with n-type impurity ions, whereby the first semiconductor layer 254a, the gate insulating layer 213, the first gate electrode 212, and the first source/drain electrodes 215c and 215d form the n-type TFT. Also, the second source/drain regions 225a and 225b are doped with p-type impurity ions, whereby the second semiconductor layer 254b, the gate insulating layer 213, the second gate electrode 222, and the second source/drain electrodes 225c and 225d form the p-type TFT.

The transmitting electrode 217b is overlapped with the storage electrode 219, thereby forming a storage capacitor.

Also, a deposition layer of the passivation layer 216 and the organic insulating layer 316 is formed at a thickness corresponding to a cell gap of the liquid crystal cell, and is removed in the transmitting part, thereby forming an open area 281 of the transmitting part. The transmitting electrode 217b of the transmitting part is in contact with the reflective electrode 217a of the reflective part through the open area 218 of the transmitting part.

A method for fabricating the transflective type LCD device according to the second embodiment of the present invention will be described as follows.

Until forming the insulating interlayer, the fabrication process of the transflective type LCD device according to the second embodiment of the present invention have the same steps as those of the transflective type LCD device according to the first embodiment of the present invention. This will be described in detail.

Figure 5A:
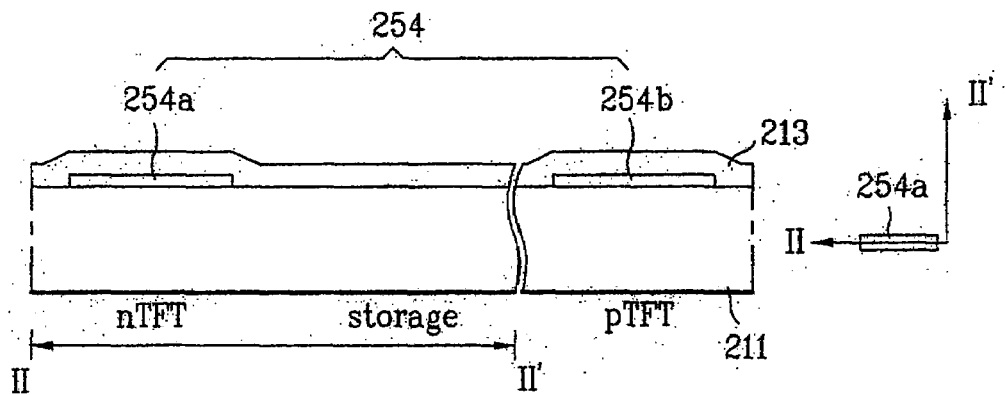
FIG. 5A to FIG. 5J are cross sectional views of a method for fabricating a transflective type LCD device according to the second embodiment of the present invention, also, plane views along II-II'.

First, as illustrated in FIG. 5A, an amorphous silicon is deposited on the insulating substrate 211 by PECVD method using a mixing gas of $SiH_4$ and $H_2$, and a laser beam is irradiated thereto as a heat treatment, whereby the amorphous silicon is crystallized to a polysilicon. By photolithography using a first photoresist and a first mask, the first and second semiconductor layers 254a and 254b are formed in an island (isolated) shape. At this time, the first semiconductor layer 254a is formed at a portion for the n-type TFT, and the second semiconductor layer 254b is formed at a portion for the p-type TFT.

After that, an inorganic insulating material such as silicon oxide $SiO_x$ or silicon nitride $SiN_x$ is formed on the entire surface of the insulating substrate 211 including the semiconductor layer 254 by PECVD method, thereby forming the gate insulating layer 213.

Figure 5B:
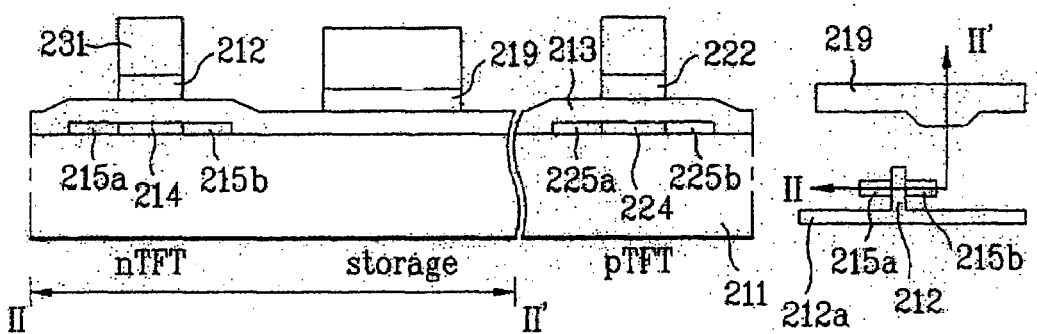

Then, as illustrated in FIG. 5B, a low-resistance metal layer, for example, copper Cu, aluminum Al, aluminum neodymium AlNd, molybdenum Mo, chrome Cr, titanium Ti, tantalum Ta, or molybdenum-tungsten MoW, is deposited on the gate insulating layer 213, and then a second photoresist 231 is coated thereon. After patterning the second photoresist 231 by photolithography using a second mask, the low-resistance metal layer is wet-etched with HF, BOE, NH4F, or mixture thereof, thereby forming the first and second gate electrodes 212 and 222 and the storage electrode 219. At this time, the first and second gate electrodes 212 and 222 and the gate line 212a are formed at the same time, wherein the gate line 212a transmits scanning signals.

Figure 5C:
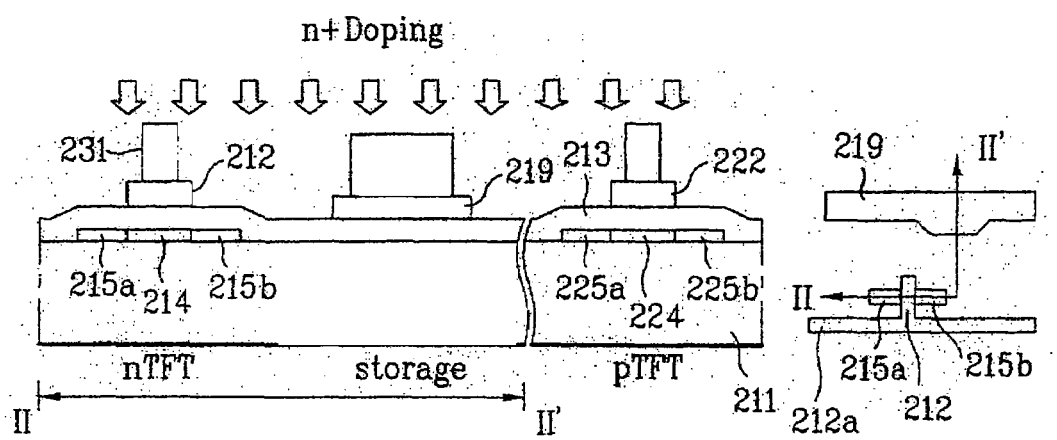

Subsequently, as illustrated in FIG. 5C, by ashing the second photoresist 231, a width of the second photoresist 231 is decreased. Then, highly doped n-type impurity ions are implanted to the first and second semiconductor layers 254a and 254b by using the decreased second photoresist 231 and the first and second gate electrodes 212 and 222 as a mask. That is, the first and second source/drain regions 215a/215b and 225a/225b of n-type doping layer are formed in the n-type TFT region and the p-type TFT region. At this time, the n-type doping layer formed by implanting the impurity ions to the p-type TFT region is changed to the p-type doping layer by implanting the p-type impurity ions thereto.

Figure 5D:
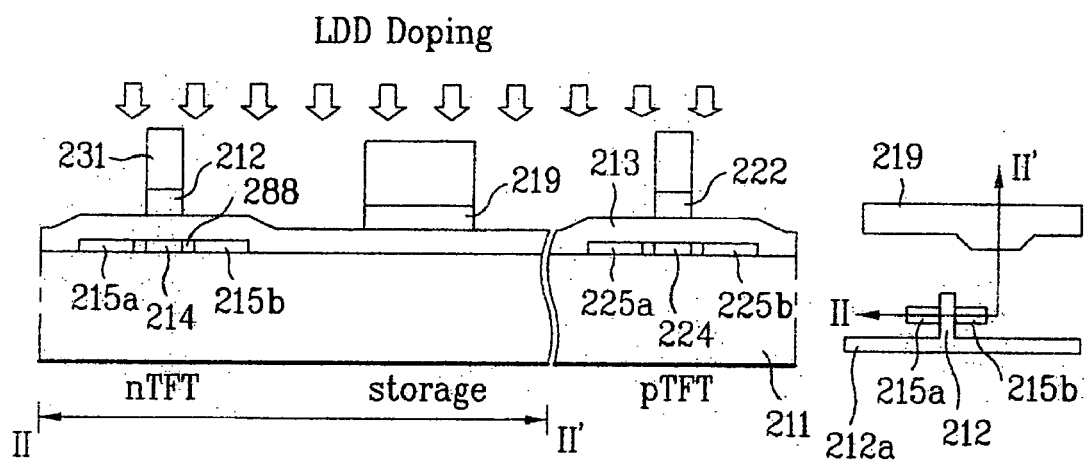

Next, as illustrated in FIG. 5D, the first and second gate electrodes 212 and 222 are etched from sidewalls thereof by etch-back using the decreased second photoresist 231 as a mask. Then, the n-type impurity ions are lightly doped to the first and second semiconductor layers 254a and 254b, thereby forming an LDD doping layer 288 of n-type doping layer.

Figure 5E:
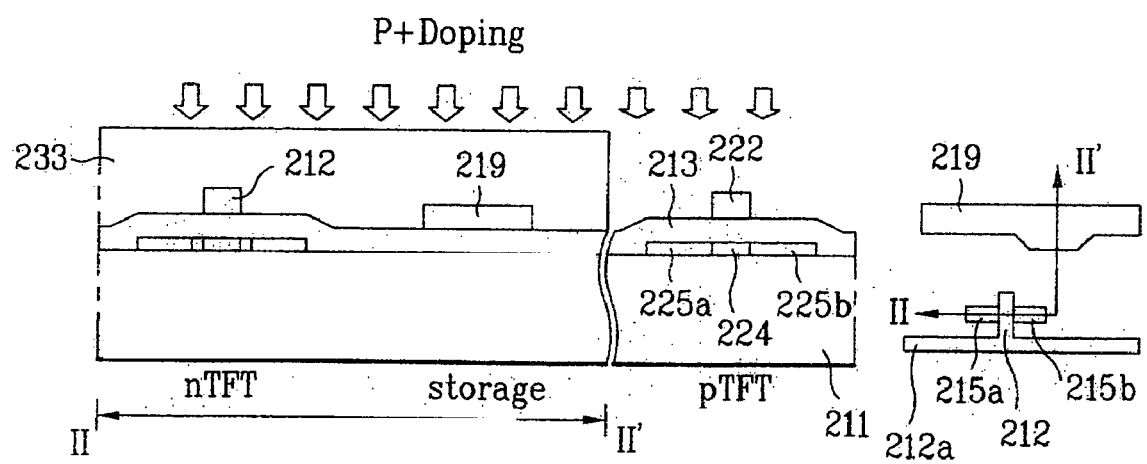

Subsequently, as illustrated in FIG. 5E, after stripping the second photoresist 231, a third photoresist 233 is coated on the entire surface of the substrate, and then patterned by exposure and developing process using a third mask, to expose the p-type TFT region. After that, the p-type impurity ions are counter-doped on the entire surface of the insulating substrate 211, whereby the second source/drain regions 225a and 225b of the p-type TFT region are changed to the p-type. At this time, the undoped second semiconductor layer 254b serve as a second channel layer 224.

Figure 5F:
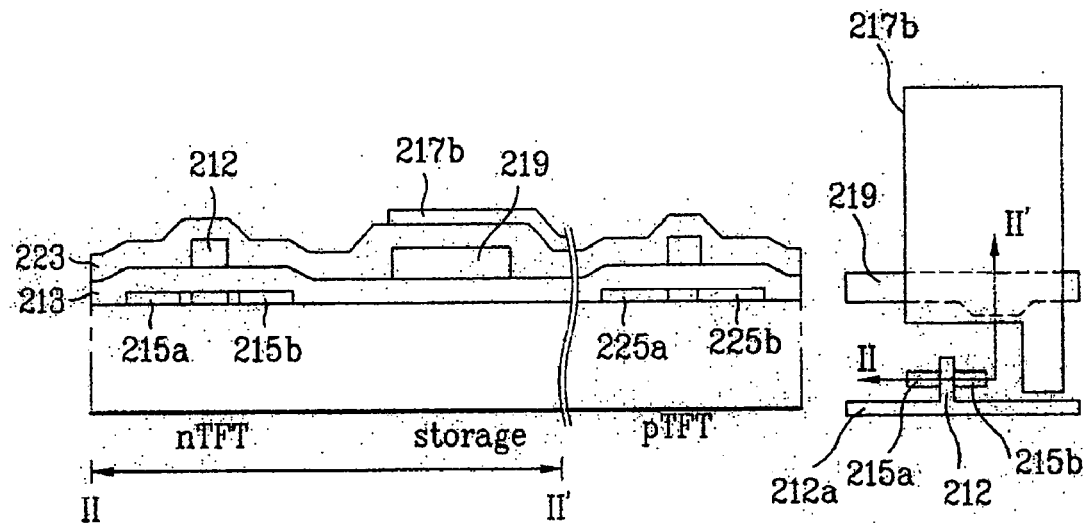

After stripping the third photoresist 233, as illustrated in FIG. 5F, the insulating interlayer 223 is formed on the entire surface of the substrate including the first gate electrode 212. After that, a transparent conductive layer of ITO or IZO is formed on the entire surface of the substrate including the insulating interlayer 223, and then patterned by photolithography using a fourth mask, thereby forming the transmitting electrode 217b. At this time, the storage capacitor is formed of the transmitting electrode 217b overlapped with the storage electrode 219, the storage electrode 219, and the insulating interlayer 223 interposed between the storage electrode 219 and the transmitting electrode 217b. Thus, additional processes for forming the storage capacitor are not required.

Figure 5G:
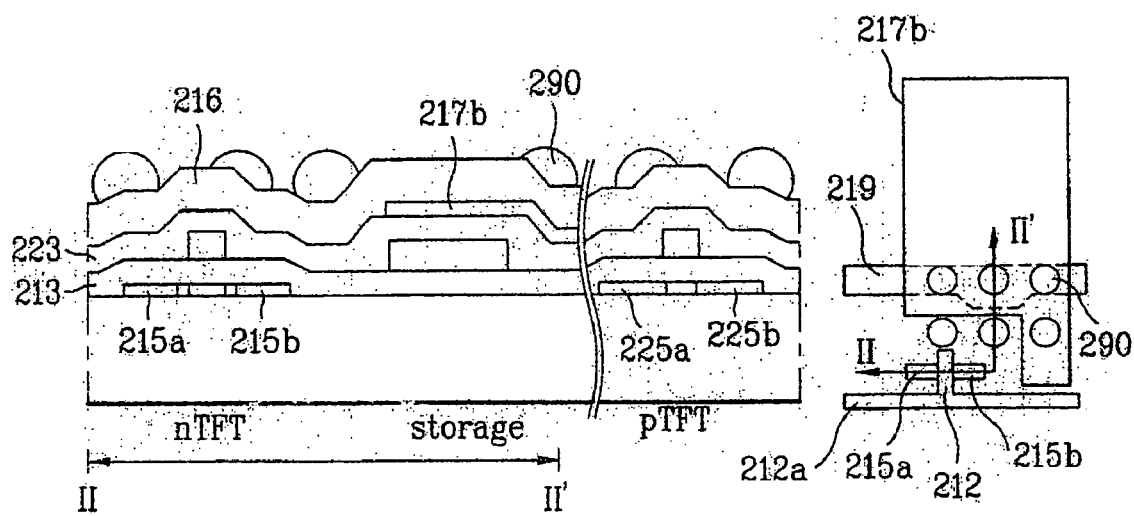

Subsequently, as illustrated in FIG. 5G, the passivation layer 216 is deposited on the entire surface of the substrate including the transmitting electrode 217b. Thereafter, a organic material(e.x., photoacryl resin and BCB) is thickly coated thereon, and then patterned by photolithography using a fifth mask, thereby forming the plurality of spherical projection patterns 290. The projection patterns 290 may be uniformly formed on the entire area of the pixel regions. Or, the projection patterns 290 may be formed in the reflective part of the pixel region, to prevent luminance of light emitted from a backlight from being lowered. In one aspect of the present embodiment, the projection patterns are formed in the reflective part of the pixel region. In this case, to control the curvature of the projection patterns 290, by ashing the organic material for a predetermined time period, the organic material may reflow.

Figure 5H:
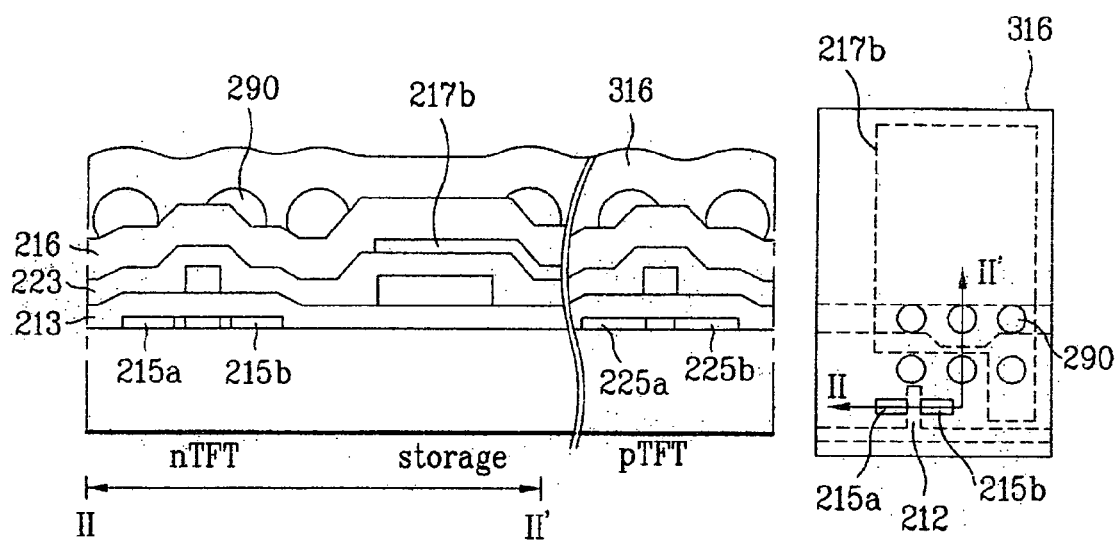

Referring to FIG. 5H, an organic insulating material having low dielectric constant, for example, BCB or acrylic resin, is coated on the entire surface of the substrate including the projection patterns 290, thereby forming the organic insulating layer 316 along the surface of the projection patterns 290. The organic insulating layer 316 protects the projection patterns 290, and controls the curvature of the projection patterns 290.

Figure 5I:
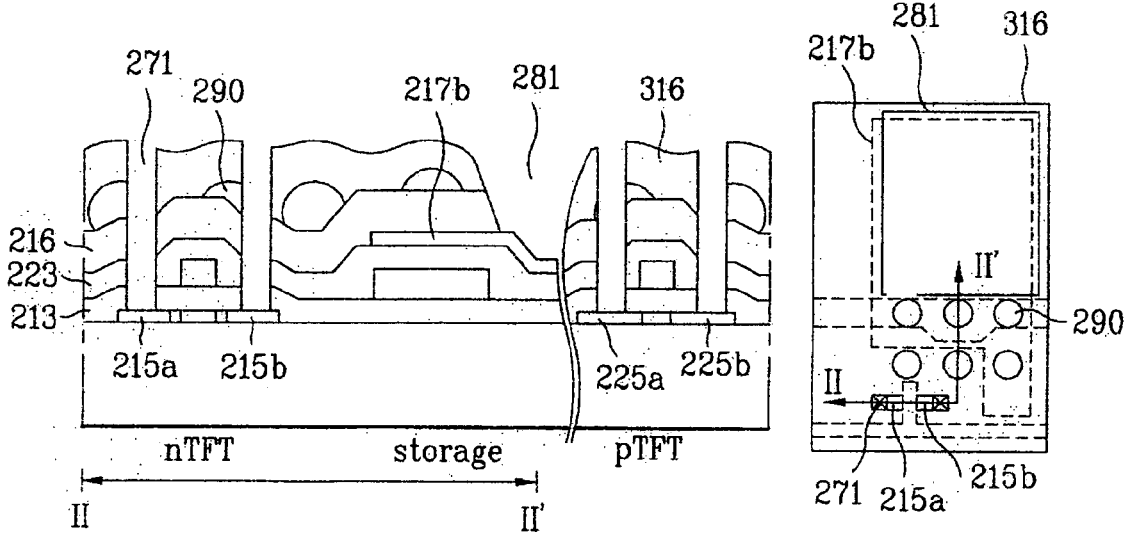

Subsequently, as illustrated in FIG. 5I, the gate insulating layer 213, the insulating interlayer 223, the passivation layer 216, and the organic insulating layer 316 are etched together by photolithography using a sixth mask, thereby forming a first contact hole 271 exposing the first and second source/drain regions 215a, 215b, 225a, and 225b of the n-type TFT region and the p-type TFT region. Simultaneously, the predetermined portion of the passivation layer 216 and the organic insulating layer 316 is removed to expose the transmitting electrode 217b, thereby forming the open area 281 of the transmitting part.

At this time, the transmitting part and the reflective part are positioned at different heights, due to the thickness of the passivation layer 216 and the organic insulating layer 316. That is, the passivation layer 216 and the organic insulating layer 316 have the a thickness corresponding to the cell gap of liquid crystal layer, whereby the transmitting part is positioned lower than the reflective part at a range corresponding to the cell gap of the liquid crystal layer. Accordingly, the light incident on the reflective part and the transmitting part reaches the surface of a screen at the same time. That is, the light incident on the reflective part from the external passes through the liquid crystal layer two times, and reaches the surface of the screen. Also, the light incident on the transmitting part from the backlight passes through the passivation layer and the organic insulating layer having a thickness substantially the same as the cell gap of the liquid crystal layer, and reaches the surface of the screen. As a result, the light incident on the reflective part and the transmitting part reaches the surface of the screen at the same time.

Meanwhile, the dry-etching method is generally used to etch the gate insulating layer 213, the insulating interlayer 223, the passivation layer 216, and the organic insulating layer 316. In the dry-etching method, gases are sprayed into an etching chamber at a high vacuum state, and the desired portion of the layer is etched by positive ions or radical. The dry-etching method is generally used for etching the insulating layer, which has the great accuracy of pattern.

Figure 5J:
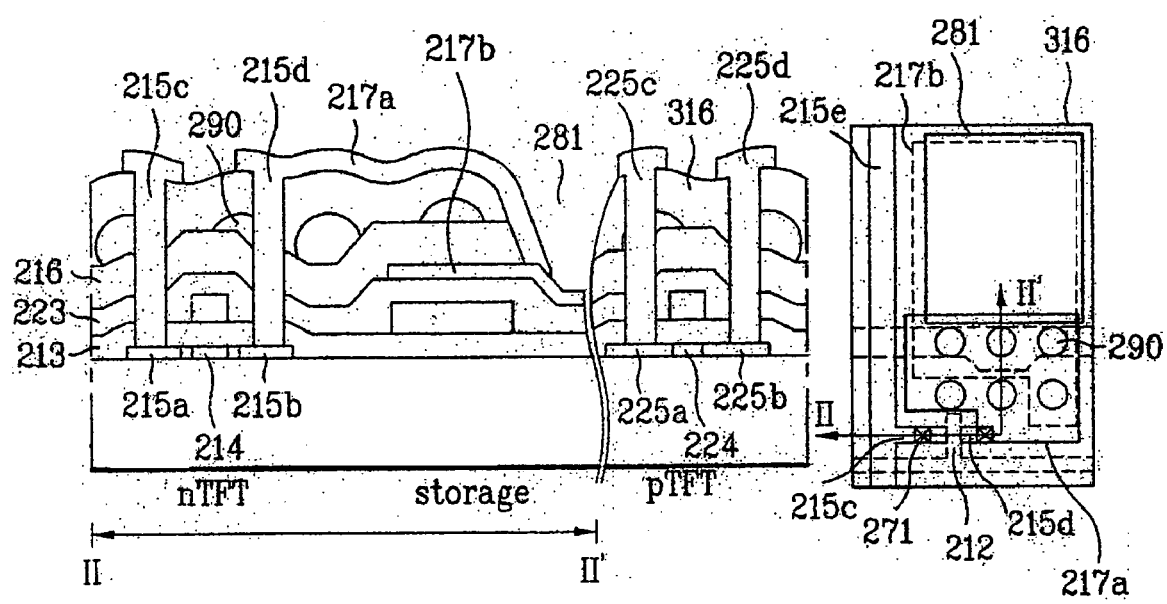

Referring to FIG. 5J, the low-resistance metal layer having high reflectivity is formed on the entire surface of the substrate including the organic insulating layer 316, and then patterned by photolithography using a seventh mask, thereby forming the first and second source/drain electrodes 215c, 215d, 225c, and 225d, and the reflective electrode 217a, at the same time.

The reflective electrode 217a is in contact with the transmitting electrode 217b through the open area 281 of the transmitting part, and the reflective electrode 217a is formed along the surface of the projection patterns 290. As a result, the reflective electrode 217a has the plurality of hemispherical reflective projections. In case the ambient light is used as the light source, the reflective projections partially change the reflection angle of ambient light, thereby widening the viewing angle by obtaining a great amount of reflective light.

The metal layer is formed of copper Cu, aluminum Al, aluminum neodymium AlNd, molybdenum Mo, chrome Cr, titanium Ti, tantalum Ta, molybdenum-tungsten MoW or the like. At this time, when forming the first source/drain electrodes 215c and 215d, the data line 215e is formed substantially perpendicular to the gate line 212a, to define the pixel region.

Also, the first and second source/drain electrodes 215c, 215d, 225c, and 225d are in contact with the first and second source/drain regions 215a, 215b, 225a, and 225b. The first source electrode 215c is formed as one with the data line 215e, and the first drain electrode 215d is formed as one with the reflective electrode 217a. By forming the source/drain electrodes and the reflective electrode at the same time, it is possible to reduce the usage count of the mask by one.

Accordingly, it is possible to complete the CMOS thin film transistor including the n-type TFT and the p-type TFT, wherein the n-type TFT is formed in each pixel region, to drive the pixel region, and has the first gate electrode 212, the first source/drain electrodes 215c and 215d, and the first channel layer 214, and the p-type TFT is formed in the driving circuit area, to apply signals to the gate and data lines, and has the second gate electrode 222, the second source/drain electrodes 225c and 225d, and the second channel layer 224. At this time, the driving circuit area further has the n-type TFT.

The fabrication process of the CMOS-TFT array substrate including the n-type TFT and the p-type TFT uses a mask seven times.

In a transflective type LCD device according to the third embodiment of the present invention, a spherical projection pattern (e.g., having a substantially spherical arced surface) of an organic insulating layer is formed on a passivation layer. Then, an organic insulating layer is formed on the projection pattern. Also, the process of forming a contact hole in the passivation layer and the organic insulating layer is performed by different etching steps. Thus, as compared with the fabrication process of the second embodiment of the present invention for etching the passivation layer and the organic insulating layer at the same time, the fabrication process of the third embodiment of the present invention is different in that the passivation layer and the organic insulating layer are etched by different steps.

FIG. 6A to FIG. 6J illustrate cross sectional views of a method for fabricating a transflective type LCD device according to the third embodiment of the present invention, also, plane views along II-II'. The fabrication process of the transflective type LCD device according to the third embodiment of the present invention is similar to the fabrication process of the transflective type LCD device according to the second embodiment of the present invention. Specifically, until the process of forming an organic insulating layer 616 on the passivation layer 516 having the projection pattern 590, the fabrication process of the third embodiment of the present invention has the same steps as those of the second embodiment of the present invention. Therefore, the explanation for the process steps until forming the organic insulating layer 616 will be omitted.

Figure 6A:
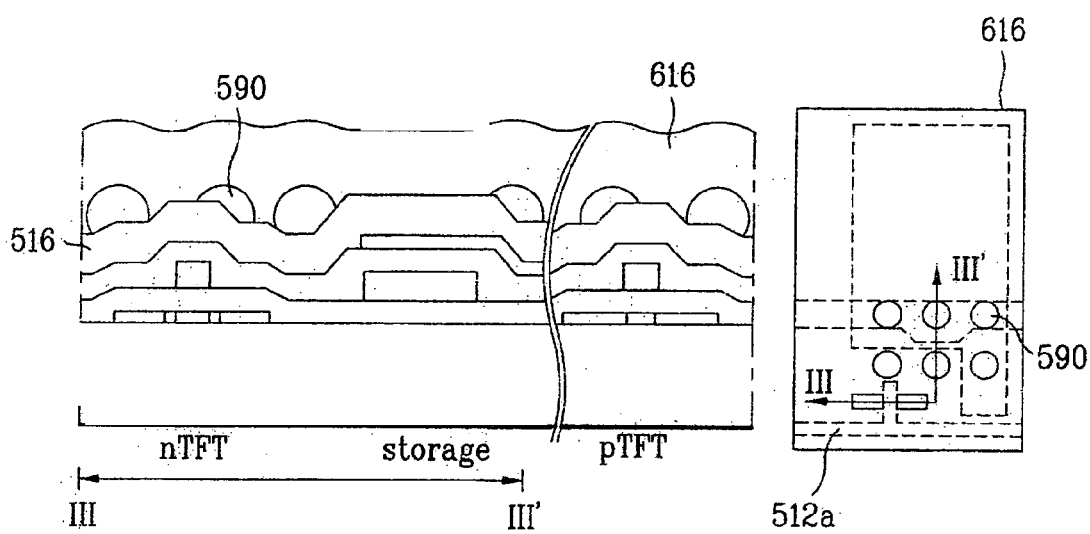
FIG. 6A to FIG. 6D are cross sectional views of a method for fabricating a transflective type LCD device according to the third embodiment of the present invention, also, plane views along III-III'.

First, as illustrated in FIG. 6A, an organic insulating material having low dielectric constant, for example, BCB or acrylic resin, is coated on an entire surface of a substrate including the passivation layer 516 having the projection pattern 590, thereby forming the organic insulating layer 616 along the surface of the projection pattern 590. The organic insulating layer 616 protects the projection pattern 590 and controls the curvature of the projection pattern 590.

Figure 6B:
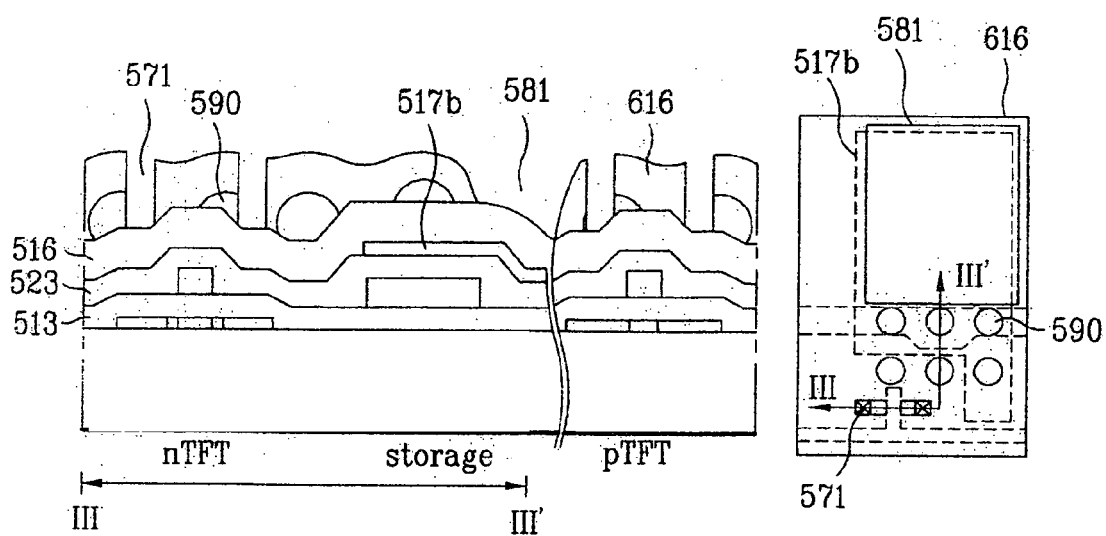

Subsequently, as illustrated in FIG. 6B, the organic insulating layer 616 is selectively removed by photolithography using a sixth mask to expose a predetermined portion of the passivation layer 516. At this time, the projection pattern 590 of the organic insulating material is selectively removed.

Figure 6C:
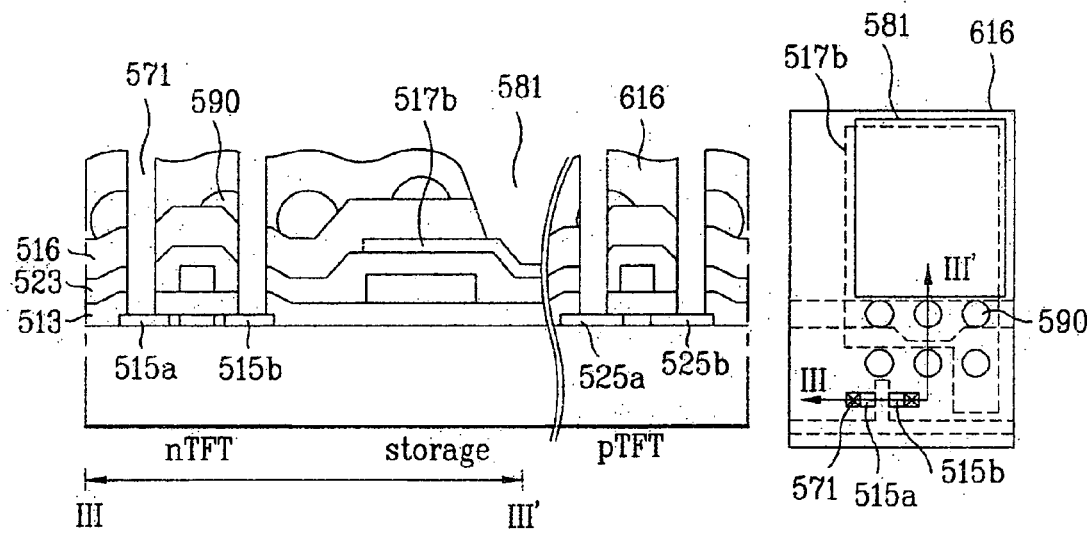

Next, as illustrated in FIG. 6C, the passivation layer 516, an insulating interlayer 523, and a gate insulating layer 513 are selectively removed by another etching process, thereby forming the first contact hole 571 exposing first and second source/drain regions 515a, 515b, 525a, and 525b of n-type TFT and p-type TFT. Simultaneously, an open area 581 is formed through the passivation layer 516 to expose most of a transmitting electrode 517b.

As described above, the process of etching the organic insulating layer 616 is separately performed from the process of etching the passivation layer 516, the insulating interlayer 523, and the gate insulating layer 513. In this respect, it is possible to solve the problem of non-uniformity of surface of the organic insulating layer. In case of etching the organic insulating layer, the passivation layer, the insulating interlayer, and the gate insulating layer, at the same time, there is an increase in fabrication process time, and non-uniform thickness of the organic insulating layer due to the collision by the gas for the dry-etching process. Also, it is possible to overcome the difficulty of controlling the process for etching the organic insulating layer, the passivation layer, the insulating interlayer, and the gate insulating layer, together.

Figure 6D:
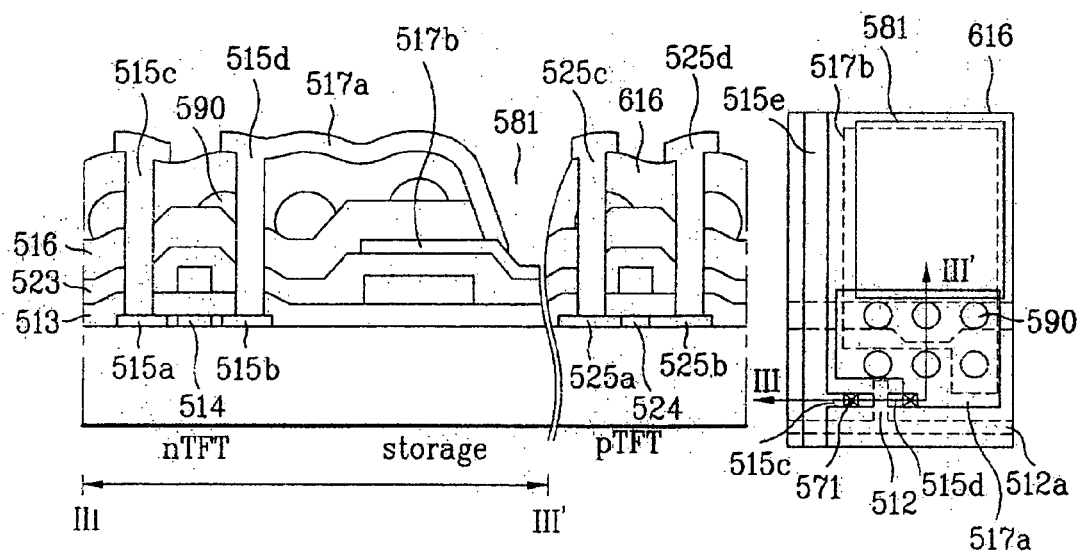

Referring to FIG. 6D, a low-resistance metal material having high reflectivity, for example, copper Cu, aluminum Al, aluminum neodymium AlNd, molybdenum Mo, chrome Cr, titanium Ti, tantalum Ta, molybdenum-tungsten MoW, or the like, is deposited on the entire surface of the substrate including the organic insulating layer 616, and then patterned by photolithography using a seventh mask, thereby forming first and second source/drain electrodes 515c, 515d, 525c, and 525d, and a reflective electrode 517a. The reflective electrode 517a is in contact with the transmitting electrode 517b through the open area 581 of the transmitting part, and the reflective electrode 517a has a plurality of hemispherical or spherical reflective projections along the surface of the projection patterns 590.

At this time, when forming the first source/drain electrodes 515c and 515d, the data line 515e is formed at the same time. The data line 515e is formed substantially perpendicular to the gate line 512a to define the pixel region.

Also, the first and second source/drain electrodes 515c, 515d, 525c, and 525d are in contact with the first and second source/drain regions 515a, 515b, 525a, and 525b. The first source electrode 515c is formed as one with the data line 515e, and the first drain electrode 515d is formed as one with the reflective electrode 517a.

Accordingly, it is possible to complete the CMOS thin film transistor including the n-type TFT and the p-type TFT, wherein the n-type TFT is formed in each pixel region or the driving circuit area and has the first gate electrode 512, the first source/drain electrodes 515c and 515d, and the first channel layer 514, and the p-type TFT is formed in the driving circuit area, and has the second gate electrode 522, the second source/drain electrodes 525c and 525d, and the second channel layer 524.

The fabrication process of the CMOS-TFT array substrate including the n-type TFT and the p-type TFT uses a mask seven times.

Although not shown, the CMOS-TFT array substrate having the n-type TFT and the p-type TFT is maintained at a predetermined interval from a facing substrate having a color filter layer by spacers, and then the two substrates are bonded to each other by sealant. Then, the liquid crystal layer is formed by injecting liquid crystal between the two substrates, and an inlet for injection of liquid crystal is sealed, thereby completing the LCD device.

As mentioned above, the transflective type LCD device according to the present invention and the method for fabricating the same have the following advantages.

By the gate etch back technology, it is possible to perform the process of highly doping the n-type impurity ions, of lightly doping the n-type impurity ions, and of counter-doping, together, with one mask.

Also, the lower electrode of the storage capacitor is formed together with the gate electrode, and the upper electrode of the storage capacitor is formed of the transmitting electrode, whereby it is possible to decrease the usage count of a mask by one.

In addition, the source/drain electrodes and the reflective electrode are formed at the same time, thereby decreasing the usage count of a mask by one.

Thus, as compared with the related art fabrication process using a mask eleven times, the fabrication process according to the present invention uses a mask seven times, thereby decreasing the fabrication process time and improving efficiency in mass production.

Also, the transmitting part and the reflective part are positioned at different heights, according the thickness of the passivation layer. That is, the passivation layer has thickness corresponding to the cell gap of the liquid crystal layer, whereby the transmitting part is positioned lower than the reflective part at a range corresponding to the cell gap of the liquid crystal layer. Accordingly, the light incident on the reflective part and the transmitting part reaches the surface of a screen at the same time.

Furthermore, the organic insulating layer is additionally formed to control the curvature of the passivation layer having the projection pattern. Also, the process of patterning the passivation layer proceeds separately from the process of patterning the organic insulating layer, thereby preventing the non-uniformity of surface of the organic insulating layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A transflective type LCD device, comprising:
   a substrate including an active area having a plurality of pixel regions and a driving circuit area for driving the active area, each pixel region having a transmitting part and a reflective part;
   a first semiconductor layer having first source/drain regions formed in the pixel region;
   a second semiconductor layer having second source/drain regions formed in the driving circuit area;
   a gate insulating layer on an entire surface of the substrate including the first and second semiconductor layers;
   first and second gate electrodes on the gate insulating layer above the first and second semiconductor layers;
   a storage electrode in the pixel region;
   an insulating interlayer on the entire surface of the substrate;
   a transmitting electrode on the insulating interlayer of the transmitting part;
   a passivation layer on the entire surface of the substrate including the transmitting electrode;
   a reflective electrode on the passivation layer of the reflective part;
   first and second source/drain electrodes in contact with the first and second source/drain regions; and
   a liquid crystal layer between the substrate and another facing substrate.

2. The transflective type LCD device of claim 1, wherein the transmitting electrode is overlapped with the storage electrode.

3. The transflective type LCD device of claim 1, wherein the reflective electrode is formed as one with the first drain electrode.

4. The transflective type LCD device of claim 1, further comprising a gate line on the same layer as the first gate electrode in the active area.

5. The transflective type LCD device of claim 1 further comprising a data line formed as one with the first source electrode on the same layer as the reflective electrode.

6. The transflective type LCD device of claim 1, wherein the passivation layer has a projection pattern formed thereon.

7. The transflective type LCD device of claim 6, wherein the projection pattern is formed as one with the passivation layer.

8. The transflective type LCD device of claim 7, wherein the passivation layer and the projection pattern are formed of an organic insulating material.

9. The transflective type LCD device of claim 6, wherein the passivation layer and the projection pattern has a thickness corresponding to a cell gap of the liquid crystal layer.

10. The transflective type LCD device of claim 6, wherein the passivation layer is separate from the projection pattern.

11. The transflective type LCD device of claim 10, further comprising an organic insulating layer on the projection pattern.

12. The transflective type LCD device of claim 11, wherein the passivation layer and organic insulating layer includes an open area corresponding to the transmitting part.

13. The transflective type LCD device of claim 11, wherein a deposition layer of the passivation layer, the projection pattern, and the organic insulating layer has a thickness corresponding to a cell gap of the liquid crystal layer.

14. The transflective type LCD device of claim 1, wherein the passivation layer includes an open area corresponding to the transmitting part.

15. The transflective type LCD device of claim 1, further comprising an LDD layer the first source/drain regions.

16. The transflective type LCD device of claim 1, wherein the semiconductor layer is a polysilicon layer.

17. The transflective type LCD device of claim 1, further comprising a buffer layer between the substrate and the first/second semiconductor layers.

* * * * *